United States Patent [19]

Cheng

[11] Patent Number: 5,666,376
[45] Date of Patent: Sep. 9, 1997

[54] ELECTRO-OPTICAL DEVICE

[75] Inventor: Julian Cheng, Albuquerque, N. Mex.

[73] Assignee: University of New Mexico, Albuquerque, N. Mex.

[21] Appl. No.: 647,186

[22] Filed: May 9, 1996

Related U.S. Application Data

[62] Division of Ser. No. 416,606, Apr. 4, 1995, Pat. No. 5,550, 856, which is a division of Ser. No. 789,172, Nov. 8, 1991, Pat. No. 5,404,323.

[51] Int. Cl.$^6$ ....................................................... H01S 3/10
[52] U.S. Cl. ........................... 572/50; 250/214 LS; 372/8; 372/38
[58] Field of Search ........................................ 372/8, 50, 38; 250/214 LS, 551

[56] References Cited

U.S. PATENT DOCUMENTS

| | | | |
|---|---|---|---|
| 4,991,179 | 2/1991 | Deppe et al. | 372/45 |
| 5,051,573 | 9/1991 | Mizushima et al. | 250/214 LS |
| 5,132,982 | 7/1992 | Chan et al. | 372/50 |
| 5,206,872 | 4/1993 | Jewell et al. | 372/46 |

OTHER PUBLICATIONS

A. Sasaki et al., "High–Current InGa AsP–InP Phototransistors and some Monolithic Optical Devices," *IEEE Transactions on Electron Devices*, vol. ED–29, No. 9, Sep. 1982, pp. 1382–1388.

J. Campbell et al., "In/InGaAs Heterojunction Phototransistors," *IEEE Journal of Quantum Electronics*, vol. QE–17, No. 2, Feb. 1981, pp. 264–269.

I. Ogura et al., "Reconfigurable optical interconnection using a two–dimensional vertical to surface transmission electrophotonic device array," *Appl. Phys. Letter* 57 (6) Aug. 1990, pp. 540–542.

C. Schaus et al., "Integrated Laser/Phototransistor Optoelectronic Switching Device by Organometallic Vapour Phase Epitaxy," *electronic letters*, 24th April 1986, vol. 22, No. 9, pp. 454–456.

T. Numai et al., "Surface–emitting laser operation in vertical–to–surface transmission electrophotonic devices with a vertical cavity," *Appl. Phys. Lett.* 58(12), 25 Mar. 1991, pp. 1250–1252.

Olbright et al., "Cascadable laser Logic Devices: discrete Integration of Phototransistors with Surface–Emitting Laser Diodes," *Electronic Letters*, vol. 27, 216 (1991), Jan. 21.

P. Zhou et al., "Low Series Resistance High–Efficiency GaAs/AlGaAs Vertical–Cavity Surface Emitting Laser with Continuously Graded Mirrors grown by MOCVD," *IEEE Photonics Tech. Letters*, vol. 3, No. 7, Jul. 1991, pp. 591–593.

R.P. Bryan et al, "Cascadable Surface–Emitting Laser Logic; Demonstration of Boolean Logic," *Electronics Letters*, 23rd May 1991, vol. 27, No. 11, pp. 893–894.

*Primary Examiner*—James W. Davie
*Attorney, Agent, or Firm*—Ray G. Wilson

[57] ABSTRACT

An electro-optical device includes a vertical cavity surface emitting laser, a heterojunction light emitting device and heterojunction phototransistor on a semiconductor substrate. Layers of the heterojunction phototransistor and the heterojunction light-emitting device are electrically and optically coupled so there is regenerative optical and electrical feedback between them. Layers of the heterojunction light-emitting devices are proton implanted to control the feedback. Plural such devices are electrically and optically coupled together to perform logic functions, such as EXCLUSIVE OR, in response to optical signals.

4 Claims, 11 Drawing Sheets

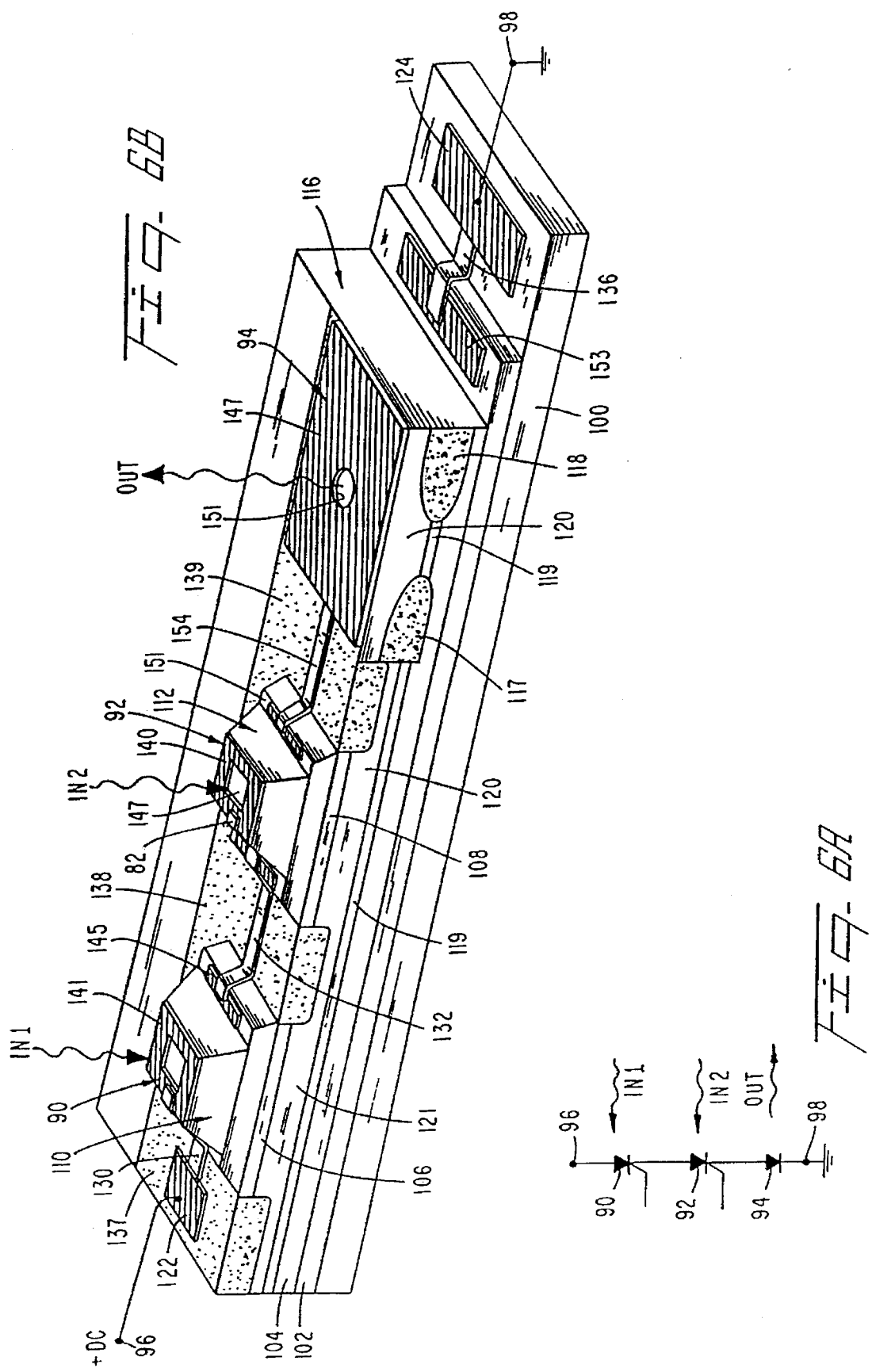

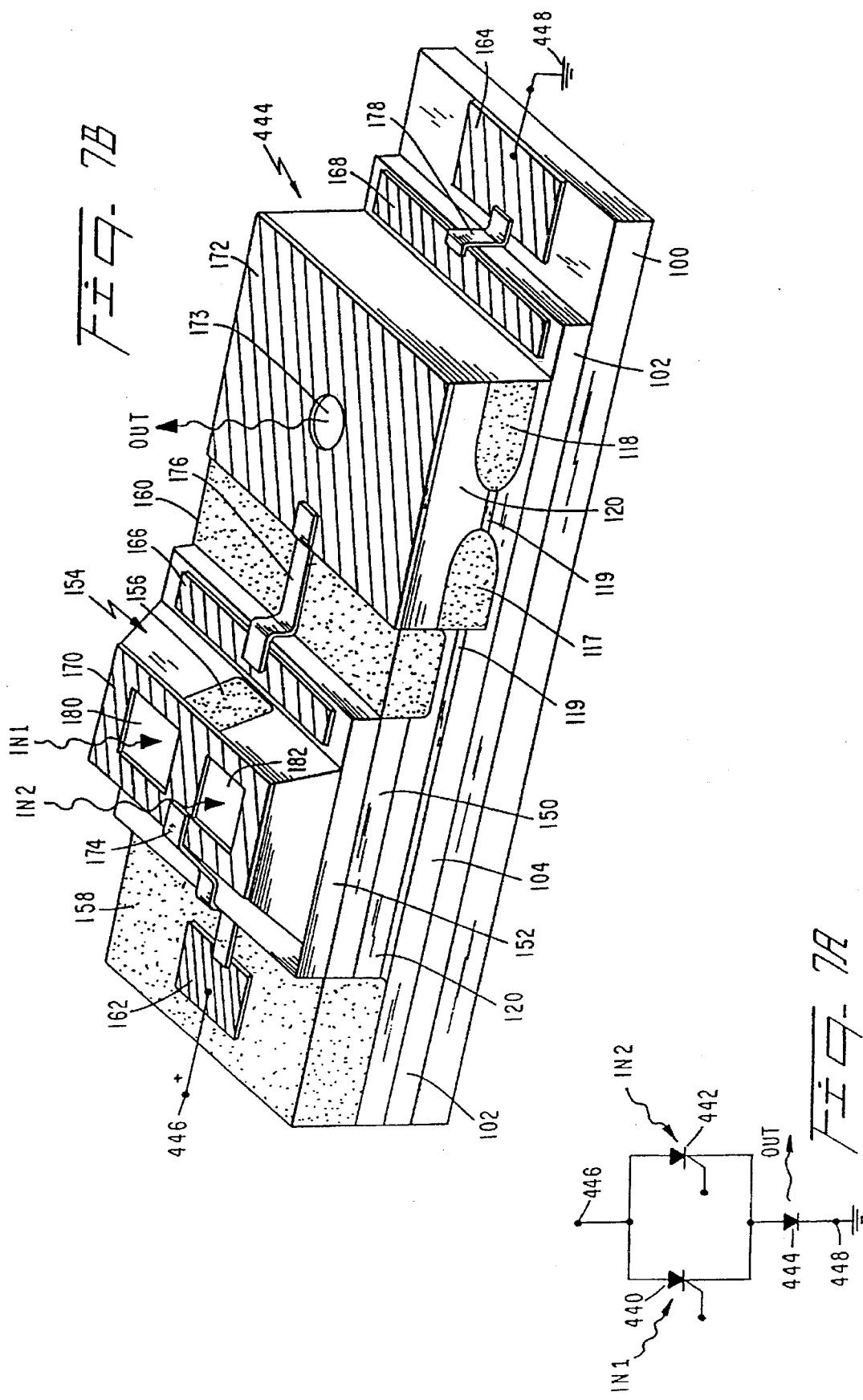

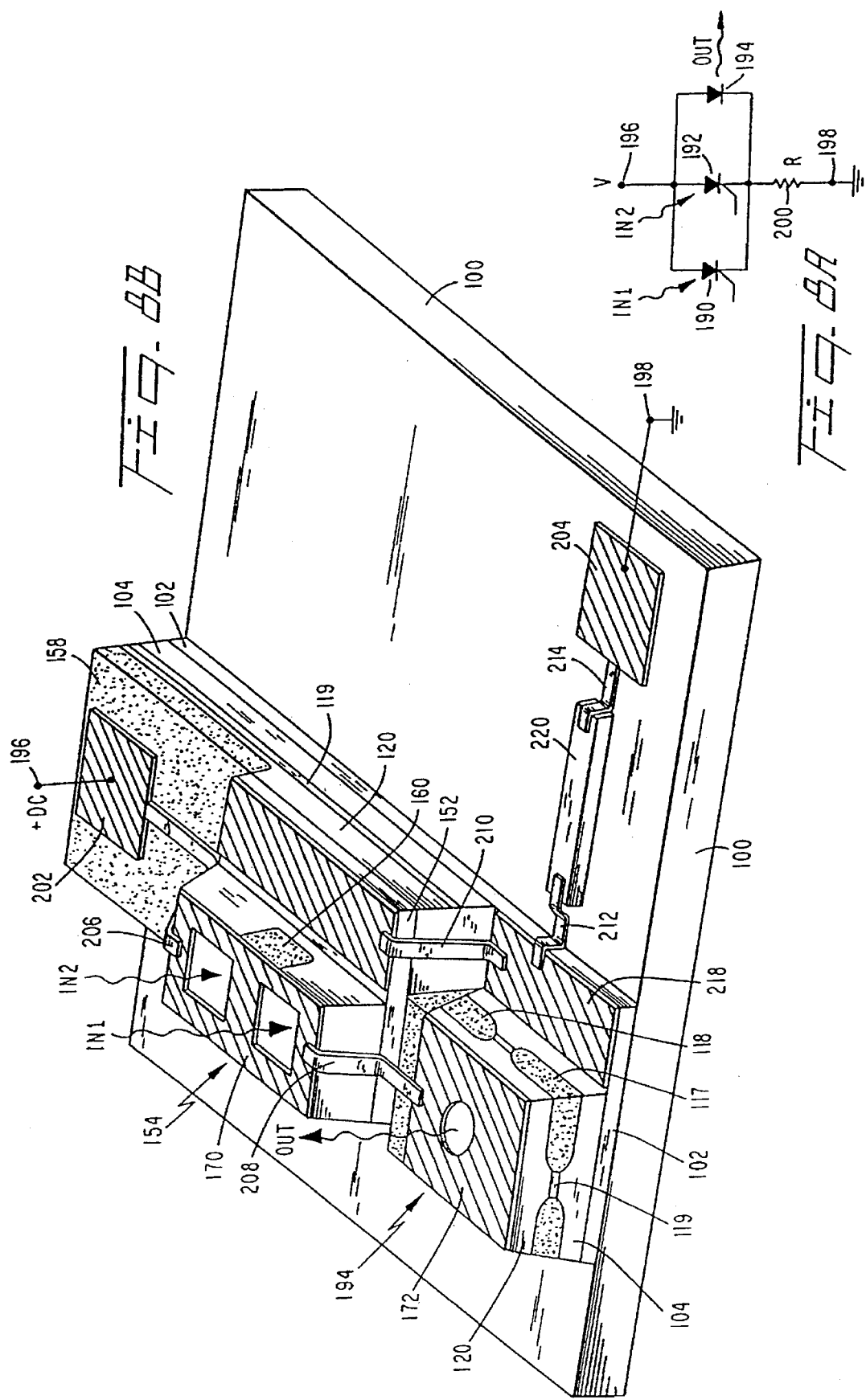

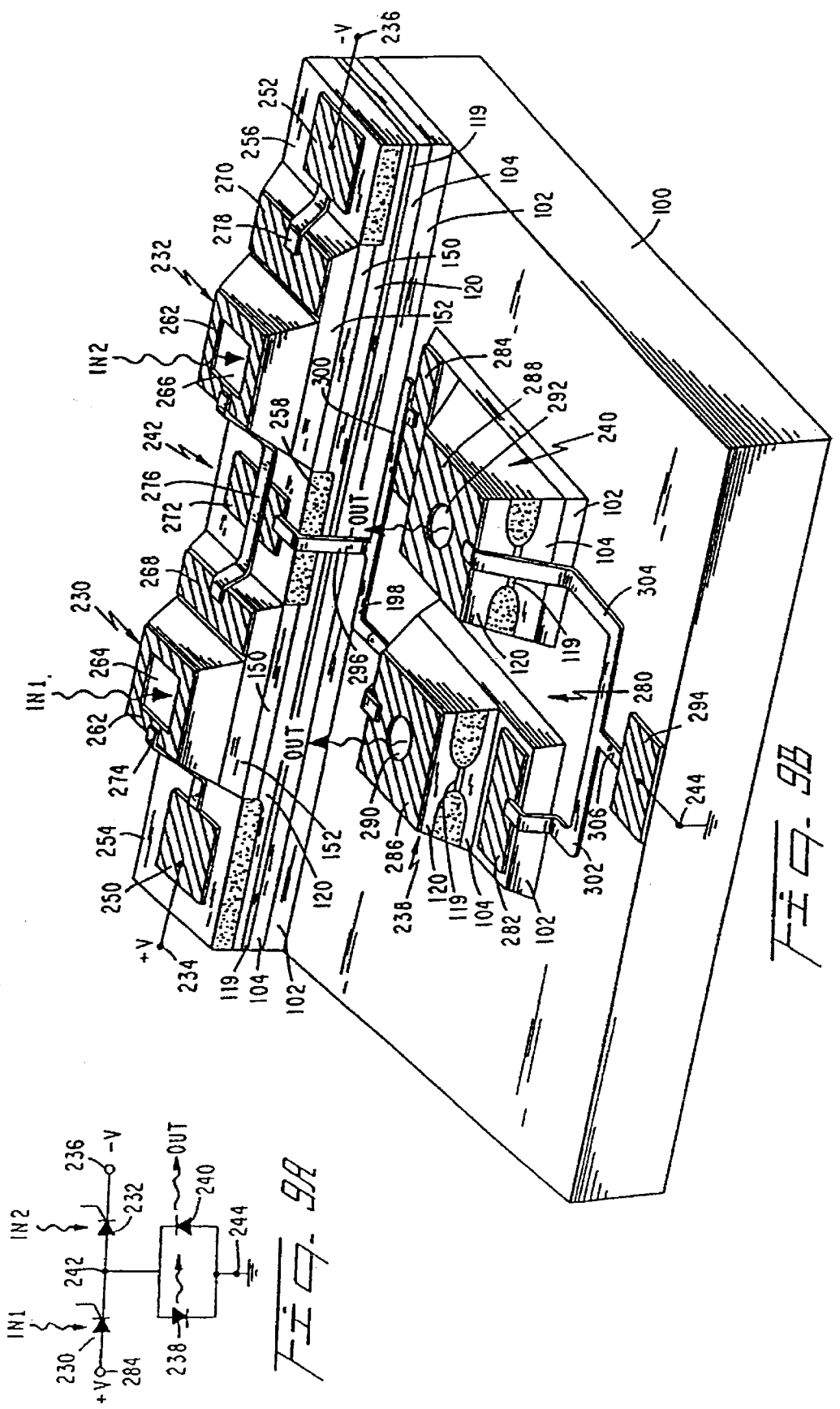

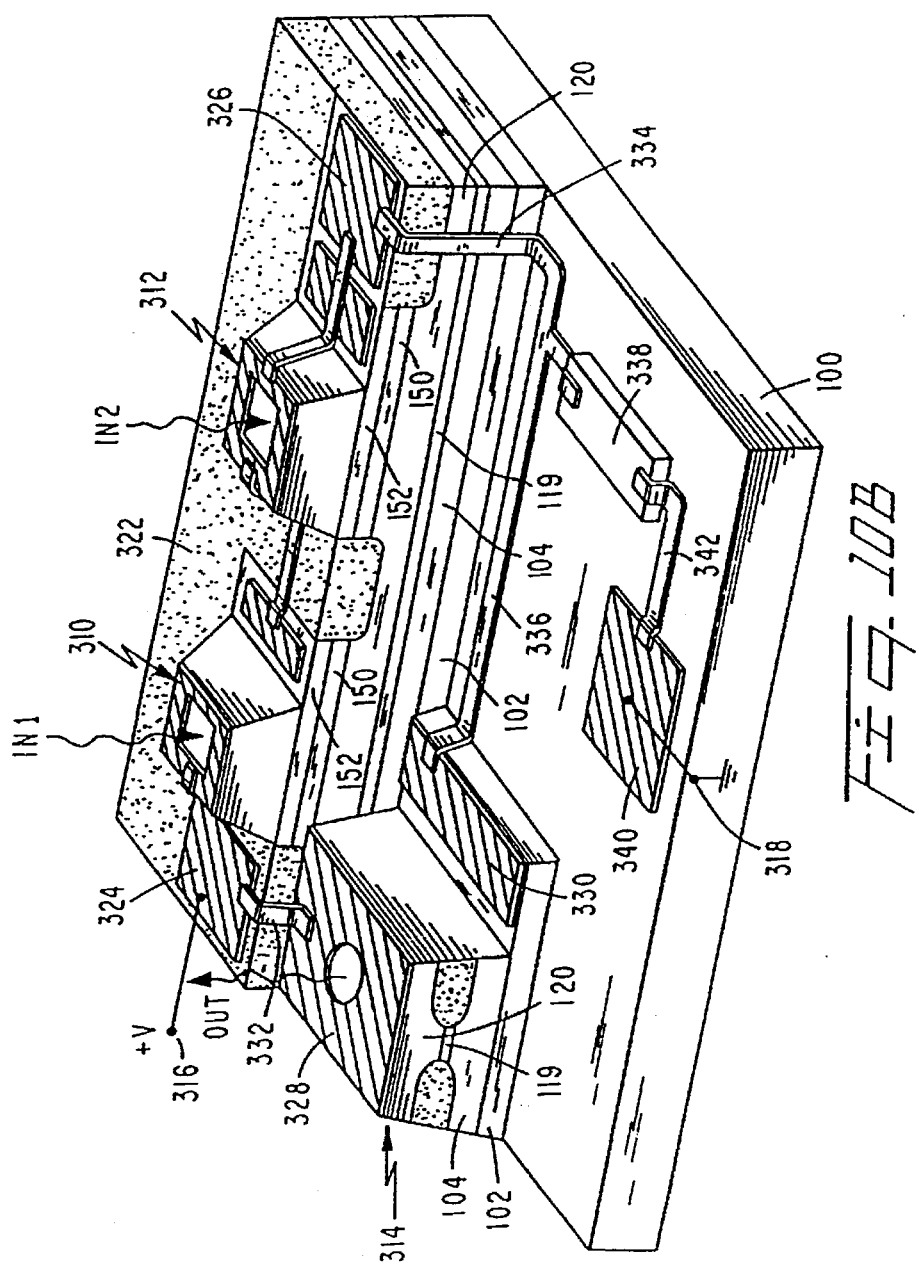
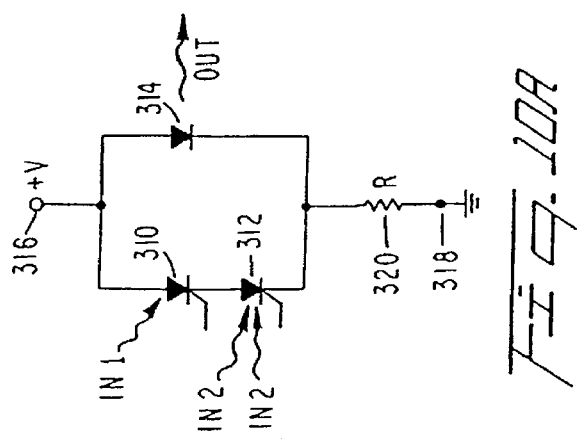

ELECTRO-OPTICAL DEVICE

This is a divisional of application Ser. No. 08/416,606 filed on Apr. 4, 1995 now U.S. Pat. No. 5,550,856 which in turn, is a divisional of application Ser. No. 07/789,172, filed Nov. 8, 1991, now U.S. Pat. No. 5,404,373.

FIELD OF INVENTION

The present invention relates generally to electro-optical devices and more particularly to an electro-optical device including a substrate carrying a vertical cavity surface emitting laser electrically cascaded to be responsive to a heterojunction phototransistor or photothyristor on the substrate.

BACKGROUND ART

The prior art has reported surface-normal optical switches using monolithic integration of a heterojunction phototransistor (HPT) with a light-emitting diode (LED); see Sasaki et al., "High Current InGaAsP-InP Phototransistors and Some Monolithic Optical Devices," *IEEE Transactions Electron Devices*, Vol. ED-29, pages 1382–1388, September 1982; Campbell et al., "InP/InGaAs Heterojunction Phototransistors," *IEEE Journal Quantum Electronics*, Vol. Q-E-17, pages 264–269, February 1981; and Ogura et al., "Reconfigurable Optical Interconnection Using a Two-Dimensional Vertical to Surface Transmission Electrophotonic Device Array," *Applied Physics Letters*, Vol. 57, pages 540–542, 1990. There is also prior art disclosing edge-emitting AlGaAs/GaAs lasers; see Schaus et al., "Integrated Lasers/Phototransistor Opto-Electronic Switching Device by Organometallic Vapor Phase Epitaxy," *Electronic Letters*, Vol. 22, pages 454–456, 1986.

Surface-normal optical switches are based on monolithic integration of an HPT with an LED, sometimes referred to as a vertical-to-surface transmission electrophonetic switch (VTSEP). VTSEP's have been integrated into relatively large (32×32) monolithic optically addressable arrays. However, LED-based switches are power inefficient devices having low optical gain and serious optical crosstalk problems. The LED-based structures are inefficient because they require high drive current, have low optical output and have little or no optical gain. In addition, the electroluminescence of light-emitting diodes is not collimated but is Lambertian, giving rise to serious optical crosstalk problems that are intolerable for a densely-packed array in a free-space optical system. Edge-emitting laser-based photothyristors are incompatible with two-dimensional array architectures. Another problem associated with many prior art electro-optical large array devices is that they are adversely affected by electromagnetic interference from various sources.

It is, accordingly, an object of the present invention to provide a new and improved electro-optical device having high efficiency, without problems of optical crosstalk and other effects of electromagnetic interference.

Another object of the invention is to provide a new and improved electro-optical integrated circuit structure for performing binary operations in response to optical signals.

A further object of the invention is to provide a new and improved electro-optical device capable of large-scale integration so that binary optical processing operations can be performed efficiently and with a minimum amount of crosstalk between devices.

An additional object of the invention is to provide a new and improved electro-optical structure, which with slight modification can perform latching, switching and bistable functions.

Still an additional object of the invention is to provide a new and improved electro-optical device incorporating a heterojunction light-emitting device electrically and optically coupled with an optical photothyristor.

Still a further object of the invention is to provide a new and improved electro-optical device wherein feedback between a light-emitting structure and a photothyristor is controlled by implantation of protons into the light-emitting device.

SUMMARY OF THE INVENTION

In accordance with one aspect of the present invention an electro-optical device comprises a semiconductor substrate on which is located a vertical cavity surface emitting laser having multiple stacked layers. Layers of the laser and a heterojunction phototransistor having plural stacked layers are optically isolated from each other because they are positioned in non-overlapping relation on the substrate. The laser and phototransistor are electrically coupled so optical energy incident on the phototransistor causes current to be coupled from the phototransistor to the laser to energize the laser into a lasing condition.

In accordance with another aspect of the invention, a heterojunction light-emitting device including plural stacked layers is located on the heterojunction phototransistor layers. The layers of the heterojunction light-emitting device and of the heterojunction phototransistor are arranged so there are optical and electrical feedback paths between them.

In accordance with one embodiment of the invention, layers of the heterojunction light-emitting device are implanted with protons to control feedback between the light-emitting device and the photothyristor so they form an electro-optical bistable device, i.e., the device (1) is switched to a first electrical state in response to optical energy exceeding a first threshold being incident on the phototransistor, (2) stays in the first state even though the optical energy drops below the first threshold, and (3) is switched to a second electrical state in response to the optical energy dropping below a second threshold, less than the first threshold.

In accordance with a further aspect of the invention, the layers of the heterojunction light-emitting device and the heterojunction phototransistor are arranged and biased to function as a photothyristor so there are regenerative optical and electrical feedback paths between them. The combined heterojunction device has a negative resistance characteristic to enable the photothyristor to be latched to an ON condition in response to optical energy incident on the phototransistor from an external source having an intensity exceeding a first determined level. The heterojunction light-emitting device and the heterojunction transistor negative resistance characteristic are such that the photothyristor is activated to an OFF condition in response to the incident optical energy having an intensity dropping below a second determined level, substantially less than the first level.

In accordance with a further aspect of the invention, vertical cavity surface emitting laser means and optical binary signal responsive heterojunction phototransistors carried on a substrate are electrically coupled to each other to provide electro-optical binary building blocks enabling binary functions such as EXCLUSIVE OR, AND, OR, NOR and NAND to be performed. Use of vertical cavity surface emitting lasers substantially eliminates optical cross-coupling, interference effects. The device has a high degree of efficiency resulting from its optical gain characteristics and low current requirements.

In accordance with an additional aspect of the invention, an electro-optical EXCLUSIVE OR gate responsive to first and second binary optical signals comprises first and second photodetectors respectively responsive to the first and second binary optical signals and connected to each other so that a node connected to the photodetectors is at first and second different voltages in response to the optical signals respectively having the same and differing values. Optical energy emitting means is connected to the node so that optical energy emitted by the emitting means has first and second states in response to the first and second voltages being at the node, respectively.

It is accordingly still an additional object of the invention to provide new and improved electro-optical binary signal processing apparatus.

It is accordingly still an additional object of the invention to provide new and improved electro-optical latch device.

It is accordingly still an additional object of the invention to provide new and improved electro-optical bistable device.

It is accordingly still an additional object of the invention to provide new and improved electro-optical EXCLUSIVE OR device.

An electro-optical apparatus for processing plural time varying binary optical input signals and for deriving plural binary output signals representing a binary operation on the input signals comprises plural first optical detectors respectively responsive to different ones of the plural optical input signals. Plural first optical emitters are respectively responsive to the first optical detectors so that a particular optical emitter is activated to an energized condition in response to a particular first optical detector corresponding with the particular first emitter having optical energy incident thereon. Plural second optical detectors are respectively responsive to optical energy from the first optical emitters. Plural second optical emitters are respectively responsive to the second optical detectors so that a particular optical emitter is activated to an energized condition in response to a particular second optical detector corresponding with the particular second emitter having optical energy incident thereon. Optical energy is coupled from the second emitters to the first optical detectors. Replicas of the optical energy coupled from the second emitters to the first detectors are the binary output signals. The first and second detectors and the first and second emitters are electrically activated so that during: a first interval the first and second detectors and first and second emitters are electrically activated, a second interval following immediately after the first interval the first detectors and first emitters are electrically activated while the second detectors and second emitters are electrically deactivated, a third interval following immediately after the second interval the first and second detectors and first and second emitters are electrically activated, and during a fourth interval following immediately after the third interval the first detectors and first emitters are electrically deactivated while the second detectors and second emitters are electrically activated. The optical emitters are incapable of emitting optical energy while they are electrically deactivated.

The above and still further objects, features and advantages of the present invention will become apparent upon consideration of the following detailed description of several specific embodiments thereof, especially when taken in conjunction with the accompanying drawings.

BRIEF DESCRIPTION OF THE DRAWING

FIGS. 6a and 6b are respectively a circuit diagram and perspective view of an AND gate in accordance with another aspect of the present invention;

FIGS. 7a and 7b are respectively a circuit diagram and perspective view of an OR gate in accordance with a further aspect of the invention;

FIGS. 8a and 8b are respectively a schematic diagram and perspective view of a NOR gate in accordance with an additional aspect of the present invention;

FIGS. 9a and 9b are respectively a schematic diagram and perspective view of an EXCLUSIVE OR gate in accordance with an added aspect of the present invention;

FIGS. 10a and 10b are respectively a schematic diagram and perspective view of a NAND gate in accordance with still another aspect of the present invention;

DESCRIPTION OF THE PREFERRED EMBODIMENTS

Figure 1:
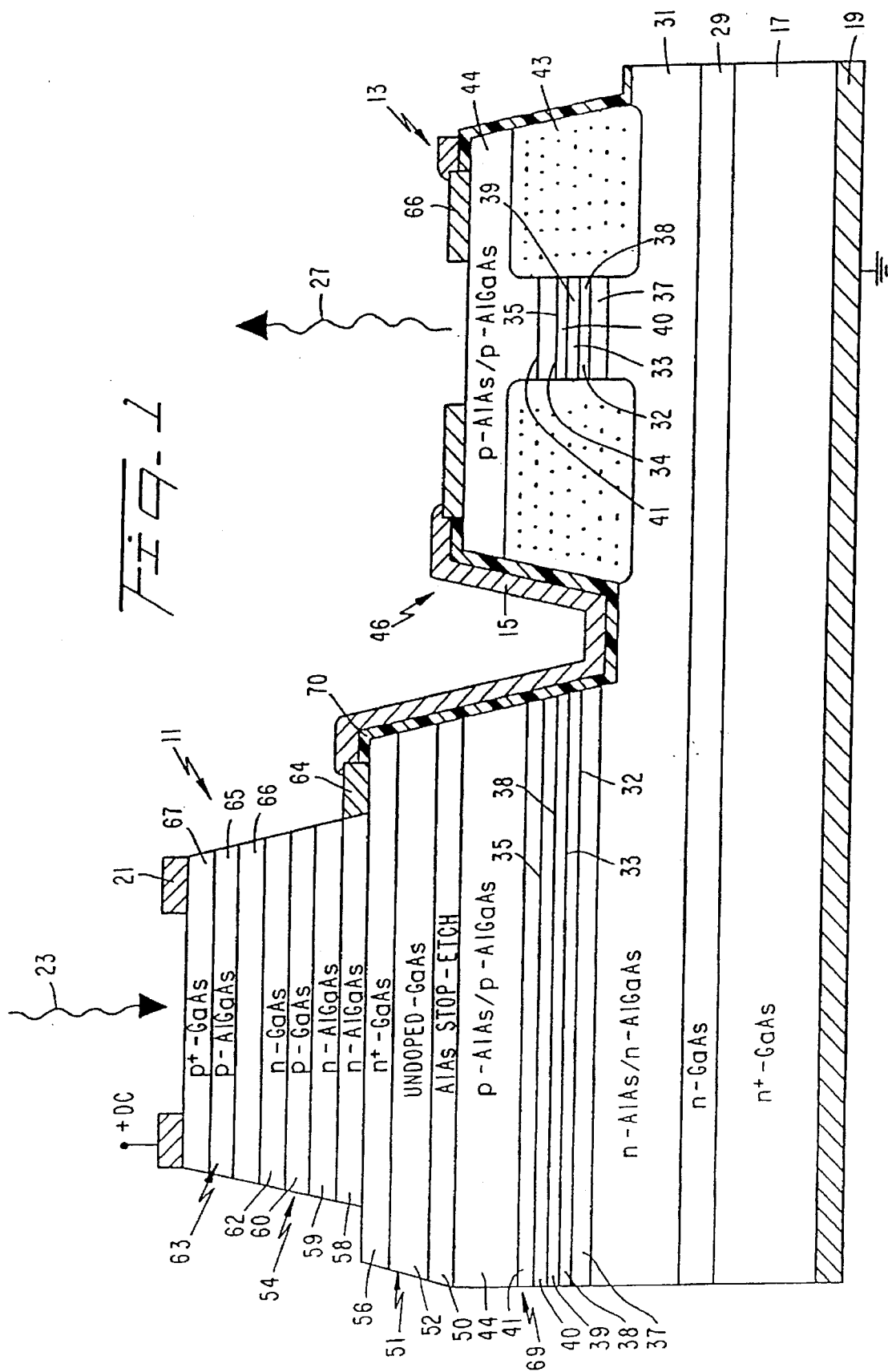
FIG. 1 is a side view of an integrated circuit including a latched photothyristor in combination with a vertical cavity surface emitting laser in accordance with a preferred embodiment of the invention.

Reference is now made to FIG. 1 of the drawing wherein latched heterojunction optical detecting photothyristor 11 and vertical cavity surface emitting laser 13 are illustrated as being electrically connected to each other by metal film 15, all carried on semiconductor substrate 17. The composite structure illustrated in FIG. 1 is electrically energized by applying ground potential to ground plane metal layer 19 on the bottom face of substrate 17 and by applying a positive DC voltage to metal electrode 21 on the uppermost surface of photothyristor 11.

In response to optical energy having an intensity above a certain level being normally incident on the top surface of photothyristor 11, as indicated by wavy line 23, the impedance of the optical detector is reduced from a relatively large value to a very small value so that the positive voltage applied to electrode 21 is substantially coupled through the photothyristor via conductor 15 to electrode 25 on the top surface of laser 13. In response to the voltage applied to electrode 25 at the top surface of laser 13, the laser is activated into a lasing condition, to emit optical energy, indicated by wavy line 27, normally from the laser top surface. The coherent optical energy emitted by laser 13 has the same wavelength as the optical energy incident on photothyristor 11, which enables multiple detector and emitter structures to be optically cascaded.

In the embodiment illustrated in FIG. 1, substrate 17 is $n^+$ gallium arsenide (GaAs), on which is formed n GaAs buffer layer 29, on which is epitaxially grown a series of semiconductor mirror layers 31, constituting n type aluminum arsenide (AlAs)/n type aluminum gallium arsenide (AlGaAs) films. Active layers 32–35 and spacer layers 37–41 forming quantum wells of vertical cavity surface emitting laser 13 are then deposited on the top surface of films 31. Active layers 32–35 are spaced from each other by spacer layers 37–41. Layers 32–35 and 37–41, on the right side of FIG. 1, included in laser 13, are surrounded by ring-like proton implanted region 43, formed by bombarding an annular region of layers 32–35 and 37–41 with hydrogen ($H^+$) ions. On layer 41 is epitaxially deposited a series of semiconductor films 44, forming a passive semiconductor mirror; mirror 44 is constituted by successive films of p-AlAs/p-AlGaAs. Groove 46 is then formed between the portions of layers 32–35 and 37–41 on the left side of the drawing and the left portion of the wall of annular proton implant 43.

Isolation layers 50 and 52 are then deposited in sequence on the top surface of mirror films 44 on the left side of the drawing. Layer 50 is an undoped aluminum arsenide stop-etch layer, while layer 52 is a relatively thick undoped gallium arsenide layer deposited on layer 50. Contact layer 56, formed of $n^+$ GaAs, is deposited layer 52. Layers 50, 52 and 56 form an isolation p-i-n diode.

Heterojunction optical detecting phototransistor 54, constituting part of photothyristor 11, is formed on contact layer 56. Heterojunction phototransistor 54 includes stacked n-AlGaAs emitter layer 59, $p^+$ GaAs base layer 60 and n-type GaAs collector layer 62. Metal film 64 is deposited on layer 56 simultaneously with deposition of metal anode film 66 on the upper surface of p-AlAs/p-AlGaAs semiconductor mirror 44 of laser 13.

To enable contacts 64 and 66 to be connected together, dielectric film 70 is deposited in groove 46. Metal strip 15 is deposited on dielectric layer 70, to connect metal contact regions 64 and 66 together.

After n-type gallium arsenide collector layer 62 of heterojunction phototransistor 56 has been deposited, light-emitting diode 63 is formed on the phototransistor. To this end, p-type aluminum gallium arsenide layer 65 is deposited on n-type gallium arsenide layer 62 to form a light-emitting diode junction. $P^+$ gallium arsenide contact layer 67 is then formed on p-type aluminum gallium arsenide layer 65. Metal layer 21 is then deposited on $p^+$ gallium arsenide layer 65.

The combination of light-emitting diode 63 and heterojunction phototransistor 54 forms latched pnpn photothyristor 11. Photothyristor 11 is grown above vertical cavity surface emitting laser 69 on the left side of FIG. 1. The structures are preferably formed as grown layers by using low-pressure metallic organic vapor phase epitaxial deposition. Laser structure 69 on the left side of FIG. 1 and the layers of photothyristor 11 are spaced by undoped stop-etched AlAs layer 50 and thick undoped GaAs isolation layer 52 included in reverse-biased p-i-n diode 51. Diode 51 electrically isolates photothyristor 11 from laser structure 69. Pnpn heterojunction latching photothyristor 11 thus comprises n-p-n heterojunction phototransistor 54 in series with heterojunction light-emitting diode 63.

Photothyristor 11 includes strong positive, i.e., regenerative, optical and electrical feedback between light-emitting diode 63 and phototransistor 54. The strong positive feedback enables switching to be provided with a low intensity optical signal 23 to provide a larger optical gain than can be obtained with a threshold responsive heterojunction phototransistor vertical cavity surface emitting laser switch in the absence of optical feedback.

In a preferred embodiment the active vertical cavity surface emitting laser of structures 13 and 69 contains four eight-nanometer thick gallium arsenide quantum wells 32, 33, 34 and 35 separated from each other and mirrors 31 and 44 by sets of two-nanometer thick $Al_{0.15}Ga_{0.85}As$ spacer layers 37, 38, 39, 40 and 41 embedded between two multilayer distributed Bragg reflector (mirror) stacks 37 and 44 respectively containing 43.5 and 24 pairs of quarterwave AlAs and $Al_{0.15}Ga_{0.85}As$ layers. Interfaces in distributed Bragg reflector mirrors 31 and 44 are continuously graded to improve laser electrical characteristics. Photothyristor structure 11 is epitaxially regrown on laser structure 69 on the left side of the drawing by organometallic vapor phase epitaxy, although the entire photothyristor structure can be grown in a single step. In a preferred embodiment, pnpn epitaxial layers 50, 52, 56, 58, 60, 62, 65 and 67 are formed as 100-nanometer undoped aluminum arsenide stop-etch layer 50, 1.5 micrometer undoped GaAs isolation layer 52, 1.0 micrometer layer 56 of $n^+$ GaAs contact (doped with $5 \times 10^{18}/cm^3$ Te), 25-nanometer lattice matching layer 58 of $Al_x Ga_{1-x}As$ (graded from x=0 to x=0.3), 300-nanometer emitter layer 59 n $Al_{0.3}Ga_{0.7}As$ ($5 \times 10^{17}/cm^3$ Te), base layer 60 of 100-nanometer $p^+GaAs$ ($5 \times 10^{18}/cm^3$ C), collector layer 62 of 300-nanometer n gallium arsenide ($1 \times 10^{17}/cm^3$ Te), sub-collector layer 66 of 600-nanometer $n^+$ gallium arsenide ($1 \times 10^{18}/cm^3$ Te), cladding layer 65 of 500-nanometer $Al_{0.3}Ga_{0.7}As$ ($5 \times 10^{18}/cm^3$ C), and contact layer 67 of 100-nanometer $p^+$ gallium arsenide ($1 \times 10^{17}/cm^3$ C).

After the laser layers have been deposited on substrate 17 there are two chemical mesa-etches ($1NH_4OH:1H_2O_2:40H_2O$) that define the area (115×100. micrometers) of photothyristor 11 and n contact area, respectively. An 18-micrometer diameter active area of laser 13 is next photolithographically defined by proton implant 43. Titanium/platinum/gold p contacts 21 and 66 and gold/germanium/nickel/gold n contact 19 are photolithographically patterned. The devices on the left and right sides of FIG. 1 are isolated with a mesa-etch that cuts through the active layer to form the separated vertical cavity surface emitting laser structures 13 and 69.

In operation, with optical energy incident on the top surface of photothyristor 11, the photothyristor provides positive optical and electrical feedback, thereby providing latching characteristics. Laser 13 is the electrical load of photothyristor 11. The positive optical and electrical feedback of photothyristor 11 eliminates the need for an optical feedback path between a laser and a phototransistor. Such an optical feedback path is frequently impractical because optical logic functions often require multiple spatially separated inputs which cannot also be responsive to the laser output. The optical and electrical feedback provided within photothyristor 11 also permits independent parameter optimization of photothyristor 11 and laser 13, without compromising the photothyristor and laser for compatibility.

Operating principles of latching optical switch including photothyristor 11 and laser 13 can be understood by considering the electrical characteristics of a two-terminal pnpn photothyristor in series with a vertical cavity surface emitting laser. The principles of a pnpn photothyristor are described with a conventional two-transistor photothyristor model having positive electrical feedback. In the case of a photothyristor comprised of an n-p-n heterojunction phototransistor and a single heterojunction light-emitting diode, radiative recombination in the light-emitting diode provides positive optical feedback; this is in addition to the positive electrical feedback provided by the photothyristor structure. The optical and electrical feedback paths produce latching electrical characteristics such that in response to a first optical signal having an intensity above a threshold being incident on photothyristor 11, the photothyristor is switched to a first state, where it remains even after the optical energy intensity incident on the photothyristor has dropped almost to zero. The latching electrical characteristic is provided as a result of a negative differential resistance region separating the photothyristor conductive (ON) and resistive (OFF) states.

Figure 2:
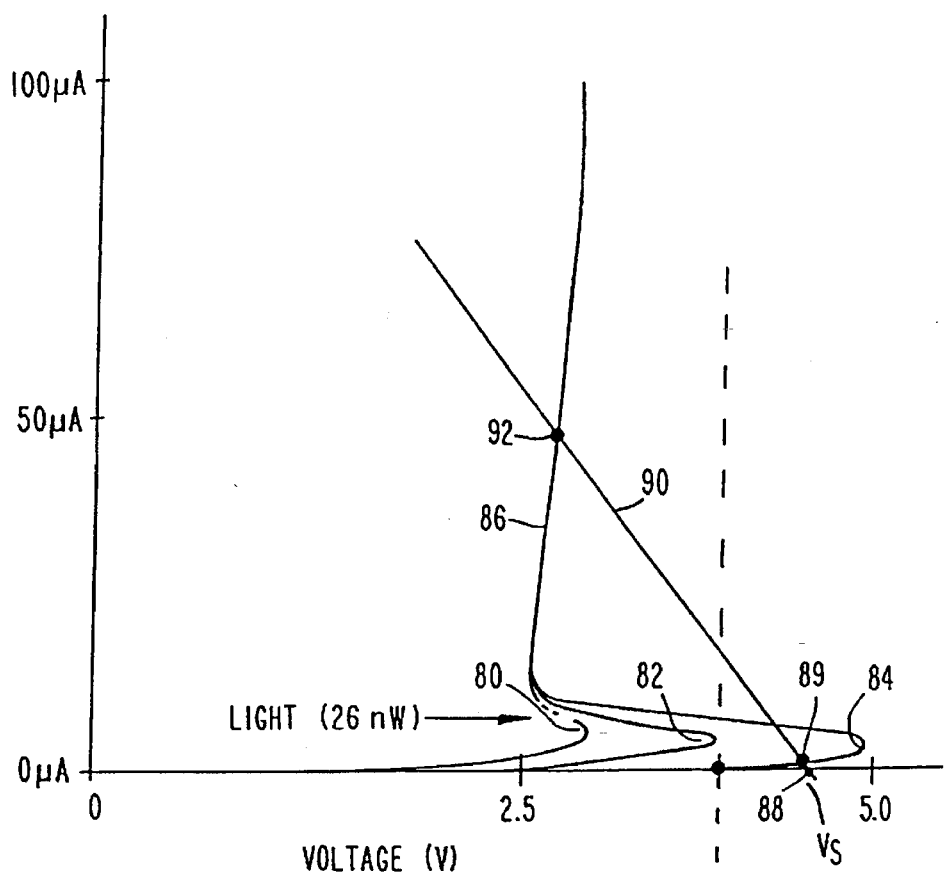
FIG. 2 is a voltage versus current plot of the device illustrated in FIG. 1, wherein negative voltage characteristics for plural values of incident light intensity are illustrated.

Certain characteristics of pnpn photothyristor 11 are illustrated in the current versus voltage diagram of FIG. 2, including a series of curves 80, 82 and 84 having negative resistance characteristics. Curves 80, 82 and 84 are for different light intensities incident on photothyristor 11, such that the light intensity associated with curve 80 is greater than the light intensity associated with curve 82, which is in turn associated with a light intensity greater than the light intensity for curve 84. Curves 80, 82 and 84 represent the current versus voltage characteristics of pnpn structure 11 for low current levels, i.e., between 0 and about 10 microamperes. For low level currents in excess of about 10 microamperes, the current versus voltage characteristic of pnpn structure 11 is a positive resistance, as represented by line segment 86.

In one configuration, the DC voltage applied to electrode 21 of pnpn structure 11 is equal to 4.2 volts, as represented by point 88 on the zero current level of FIG. 2. The electrical load of laser 13 on photothyristor 11 is represented by straight load line 90, intersecting points 88 and 92; point 92 represents the minimum voltage and current values for negative resistance characteristic 92. Under dark conditions, i.e., in response to a binary 0 optical signal being incident on the structure 11, the device functions in accordance with curve 84 so that virtually no current flows through photothyristor, as indicated by point 89. In response to an increase in the intensity of the optical energy incident on structure 11 (associated with a binary one level), as indicated by curve 80, unstable operation occurs and the operating point jumps from point 89 to point 92, at the intersection of load line 90 and straight line curve portion 86. At point 92, approximately 50 microamperes are supplied by the pnpn structure to laser 13, to trigger the laser into a lasing condition.

Optical switching occurs because the switching voltage of photothyristor 11 from the OFF state to the ON state, is reduced by the intensity of the optical energy incident on p-n-p photothyristor 11. The switching voltage is the peak voltage of each of curves 80, 82 and 84 which decreases as light intensity increases. The optically injected virtual base current of the heterojunction phototransistor performs the role of gate current supplied to the gate of a silicon controlled electronic rectifier. By supplying electrode 21 with a voltage below the photothyristor switching voltage with no optical energy incident on the photothyristor, the photothyristor is normally in the OFF state. By applying an optical pulse to photothyristor 11 the switching voltage is reduced to a value below the bias voltage, to switch the photothyristor to the ON state. In principle, the optical switching energy is somewhat arbitrary because it depends on the desired reduction in the switching voltage value. The current supplied by photothyristor 11 to laser 13, while the photothyristor is in the ON state, powers the laser 13 above its threshold, so the laser stays in a lasing condition until zero light intensity is incident on photothyristor 11.

Figure 3:
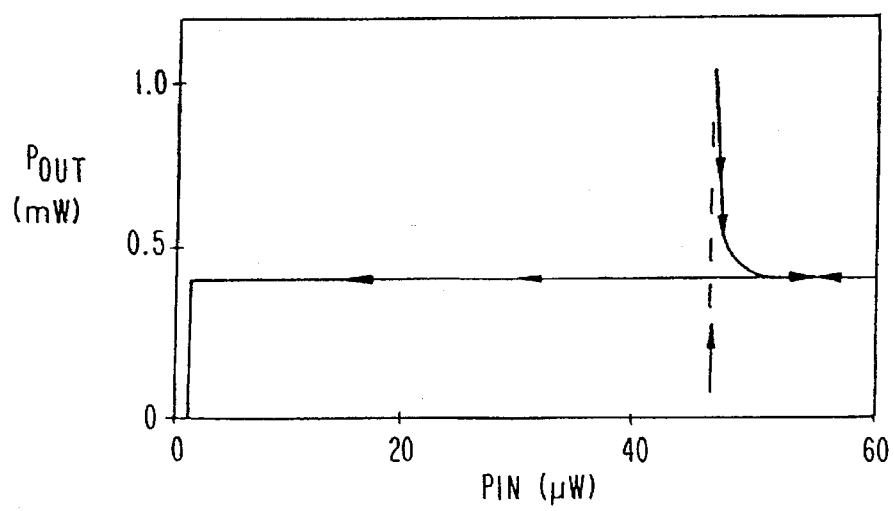
FIG. 3 is a plot of input versus output power of the device illustrated in FIG. 1.

FIG. 3 is an optical transfer curve of the device illustrated in FIG. 1, with a 4.2 volt bias being applied to electrode 21. Power of the optical energy incident on photothyristor 11 (plotted in the X direction) is in nanowatts, while output power from laser 13 (plotted in the Y direction) is in milliwatts. The device is switched into a lasing state in response to an input power level of 15 nanowatts which results in an output power of 0.35 milliwatts, to provide an optical gain of 23,000. Initially, the output power peaks at a level of 1.3 milliwatts. Due to self-heating in laser 13, laser output power decreases to 0.35 milliwatts as time progresses. Output power of laser 13 is latched at 0.35 milliwatts even if the input power to photothyristor 11 increases above or decreases below 15 nanowatts; the laser output power remains constant even if the optical energy incident the photothyristor drops virtually to zero, provided that the voltage applied to electrode 21 is above the threshold voltage required for lasing of laser 13. The ratio of switched output power level to spontaneous emission of the laser below threshold, i.e., optical contrast of the laser output, is about 30 dB.

Reducing the value of the voltage applied to electrode 21 enables the switching threshold of photothyristor 11 to be reduced to as low as 11 nanowatts. Under such circumstances, laser 13 still derives an output power of 0.35 milliwatts, to provide an optical gain of 30,000.

The electrical feedback in photothyristor 11 can be described by the two-transistor model wherein heterojunction phototransistor 54, light-emitting diode 63, and base 60 of phototransistor 54 form the npn and pnp transistor pair. In this two-transistor model, the collector current of each transistor biases the base of the other transistor to form a positive feedback loop. The current through photothyristor 11 is given by $$I = \frac{I_{cbo} + \alpha_1 I_b}{1 - \alpha_1 - \alpha_2} = I_{ceo} + \beta I_1 \qquad (1)$$

where:

$I_{cbo}$ and $I_{ceo}$ are the common-base and common-emitter leakage currents, respectively, $\alpha_1$ and $\alpha_2$ are the forward gains of the two transistors ($\alpha_1$ is much greater than $\alpha_2$), $$\beta = \frac{\alpha_1}{1 - \alpha_1 - \alpha_2} = \text{the current gain of the } p-n-p$$

device, and $I_b$ is the (virtual) base current of the heterojunction phototransistor.

The value of $\beta$ incorporates the electrical feedback characteristics of photothyristor 11 and is generally a function of the current I through and the voltage V across photothyristor 11. Switching occurs when ($\alpha_1 + \alpha_2$) approaches unity, causing $\beta$ to become large. The electrical feedback can generally be reduced by increasing the thickness of the layers of light-emitting diode 63 or by replacing the light-emitting diode with a double heterojunction structure.

The virtual base current, $I_b$, of heterojunction phototransistor 54 comprises the photocurrent induced in the base collector junction of the phototransistor in response to the optical power $P_{in}$ incident on the phototransistor and the optical feedback resulting from the electroluminescence of light-emitting diode 63. Hence, $$I_b = n \frac{eP_{in}}{h\nu} + n'I \qquad (2)$$

where:
n is the optical absorption and coupling efficiency of heterojunction phototransistor 54,
n' is the quantum efficiency of light-emitting diode 63,
h is Planck's constant,
e is the electric charge of an electron, and
$\nu$ is the mean spectral frequency of electroluminescence derived from light-emitting diode 63.

Substituting Equation (2) into Equation (1) and solving for I results in:

$$I = \frac{I_{ceo} + \beta \frac{ne}{h\nu} P_{in}}{1 - \frac{\beta n n'}{2}} \qquad (3)$$

From Equation (3), current is enhanced by the input power incident on pnpn structure 11, $P_{in}$, and by the extent of positive optical feedback $$\frac{1}{1 - \frac{\beta n n'}{2}}$$

The input power incident on photothyristor 11 also affects the switching characteristics of the photothyristor by increasing the current and therefore the current gain $\beta$. Switching is thus promoted by the combination of high gain, high electroluminescence, absorption efficiencies and by the magnitude of the input optical power. Conversely, the amount of optical feedback can be reduced by impairing efficiencies and/or gain.

The structure of FIG. 1 is such that pnpn photothyristor 11 remains latched to a conducting state until the optical energy incident thereon drops virtually to zero. For certain applications, it is desirable for a pnpn photothyristor to be switched to the OFF state in response to incident optical energy that is only somewhat less than the optical energy required to switch the photothyristor from an OFF state to an ON state. Such a result is attained by significantly reducing the amount of optical and electrical feedback between the light-emitting diode and heterojunction phototransistor structures. Such a reduction can be attained by lowering the values of $\beta$ or n by modifying the epitaxial layer design of the n-p-n structure. However, since it is desirable to monolithically integrate switches with different functionalities on a single substrate, it is preferable to reduce the electrical and optical feedback by reducing the electrical feedback through a reduction of $\alpha_2$ and therefore $\beta$. The optical feedback can also be reduced by lowering the value of n'. Structures having the stated characteristics are referred to herein as bistable devices.

Figure 4:
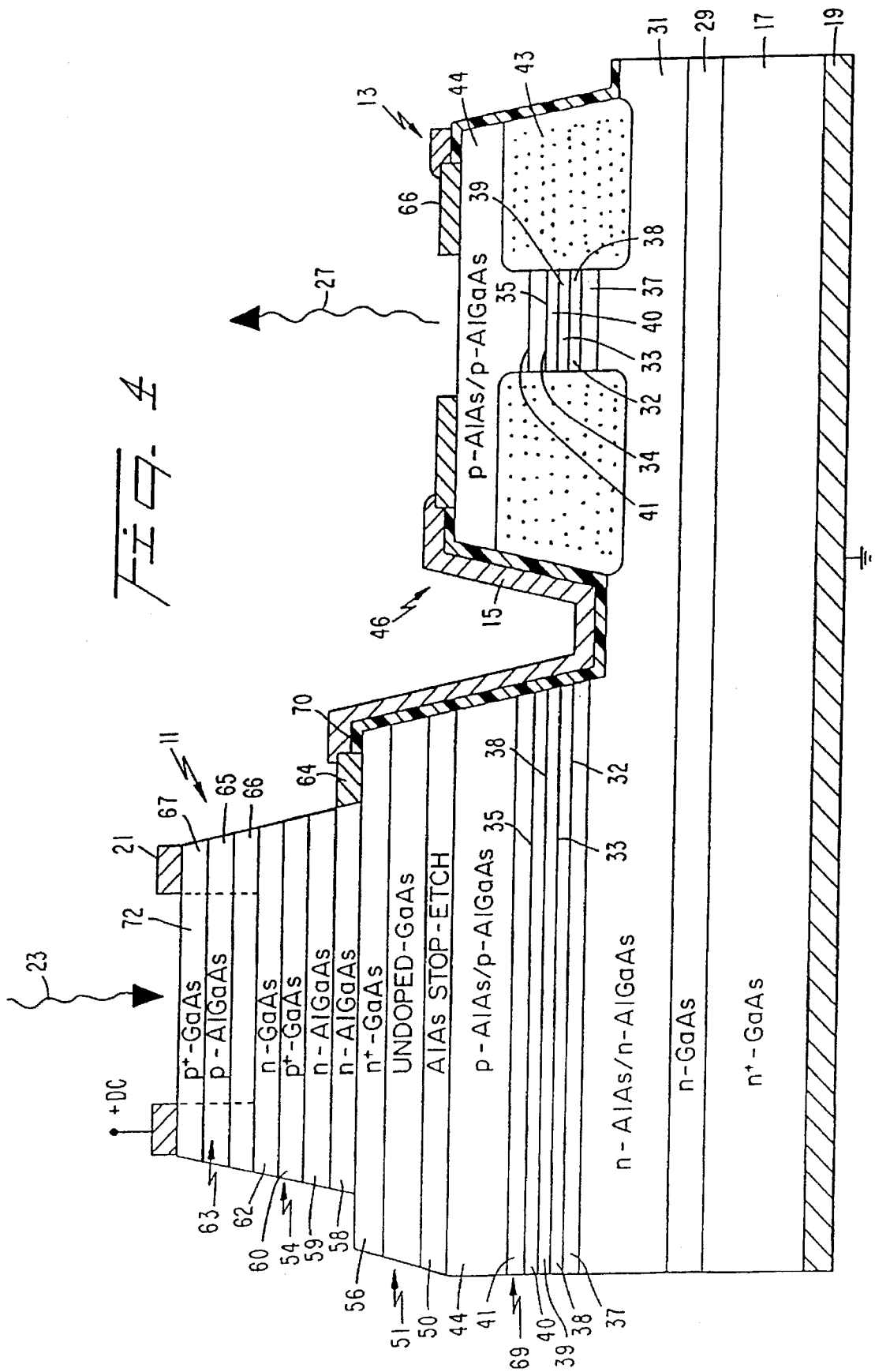
FIG. 4 is a side view of an integrated circuit including a bistable photothyristor in combination with a vertical cavity surface emitting laser in accordance with another preferred embodiment of the invention.

Such reductions in the values of $\alpha_2$ and n' are attained in accordance with a further aspect of the invention by locally impairing injection and radiative efficiency of light-emitting diode 63 by proton implantation. Such a structure is illustrated in FIG. 4 wherein H$^+$ ions are implanted in region 72 below electrode 21 in p$^+$ gallium arsenide layer 67, p AlGaAs layer 65 and n GaAs layer 66. Layers 65, 66 and 67 are implanted with hydrogen ions to provide a low dosage ($5 \times 10^{11}$/cm$^2$) proton implant. The hydrogen ions are implanted with an energy of 100 keV. The dosage and energy of the hydrogen ion implant are sufficient to affect injection efficiency of heterojunction phototransistor 59 and the radiated efficiency of light-emitting diode 63 without negative impact on conductivity of the phototransistor and light-emitting diode.

The contrast between the strongly latched switch of FIG. 1 and the bistable device of FIG. 4 is of interest. In the device of FIG. 1, $I_h$ (the ON current of the pnpn photothyristor) is less than 20 microamperes, $V_h$ (the ON voltage of the photothyristor) is 2.7 volts and $V_s$ (the peak voltage of curve 84, FIG. 3) is 5.0 volts. In the proton implanted structure of FIG. 4, the values of $I_h$, $V_h$ and $V_s$ increase to 3.8 milliamperes, 9 volts and 13 volts, respectively. The device of FIG. 4 switches to an OFF state in response to incident optical input power of about 15 microwatts, in contrast to an input power of about 1 microwatt for the device of FIG. 1. The aforementioned values are reduced as a function of increased illumination incident on the pnpn photothyristor.

Photothyristor 11 of FIG. 1 is initially in a resistive high impedance OFF state. In response to the illumination, photothyristor 11 of FIG. 1 switches into a conductive state and the resulting current drives laser 13 above its threshold value to provide lasing, i.e., optical switching. To avoid spurious switching in response to a lower optical intensity incident on the photothyristor, the current flowing in the photothyristor must not exceed the threshold current of laser 13 at the time the photothyristor is switched off. Increasing the proton implant dosage to $5 \times 10^{12}$/cm$^2$ hydrogen ions, as illustrated in FIG. 4, causes a further reduction in the efficiency of light-emitting diode 63, causing laser 13 to be activated to a lasing condition before the pnpn photothyristor 11 can be electrically switched to a conducting state in response to the optical energy incident thereon. Hence, precise control of the implantation dosage enables the device illustrated in FIG. 4 to be such that optical bistability conditions can be readily and precisely tuned, in contrast to the structure illustrated in FIG. 1.

Figure 5:
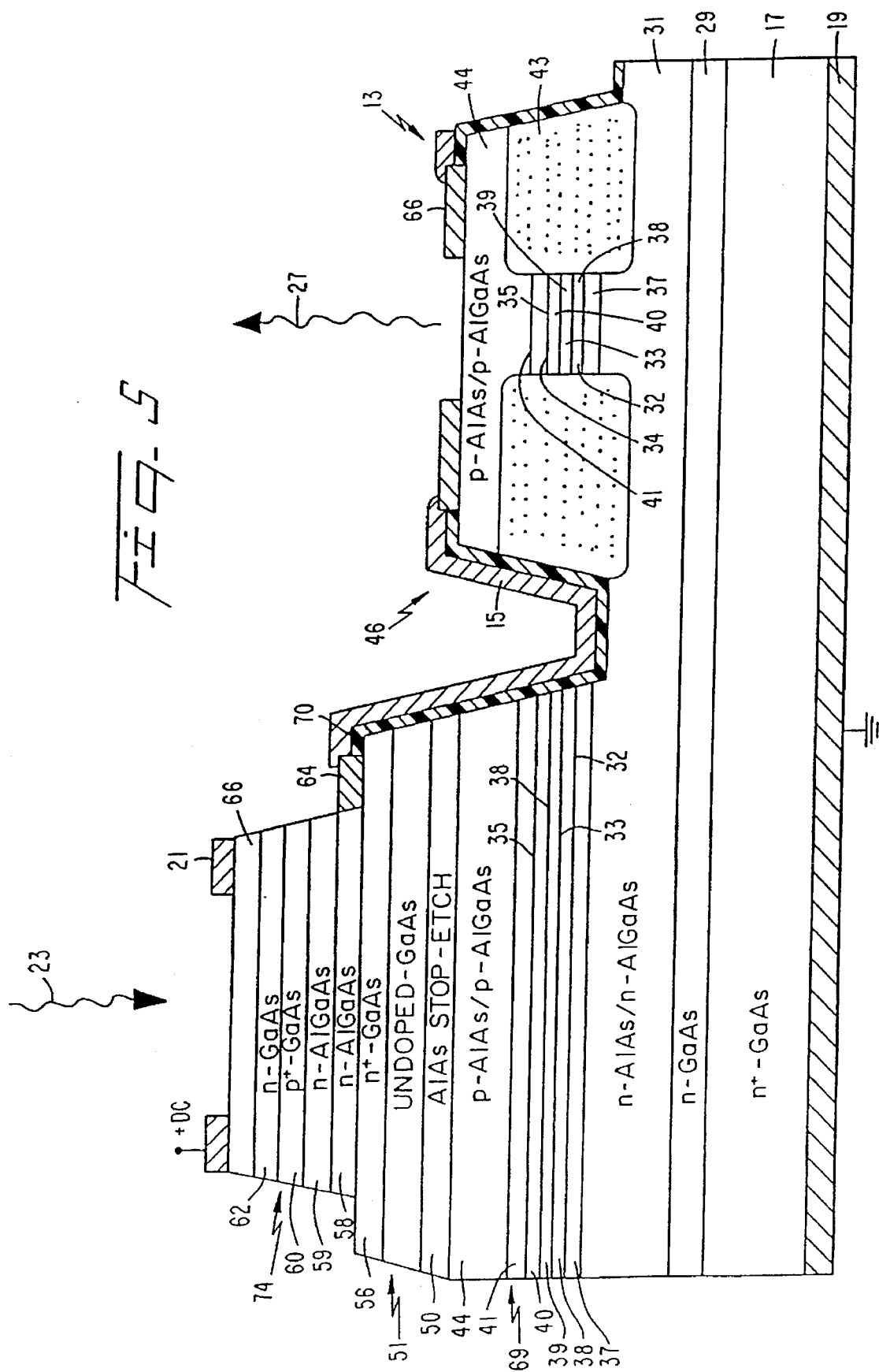
FIG. 5 is a side view of an integrated circuit including a switching heterojunction phototransistor in combination with a vertical cavity surface emitting laser in accordance with a further preferred embodiment of the invention.

In the embodiment of the invention illustrated in FIG. 5, the pnpn photothyristors of FIGS. 1 and 4 are replaced by npn heterojunction phototransistor 74. Metal film 21 is in direct contact with collector layer 60 of npn transistor 74. Emitter layers 58 and 59 of the npn heterojunction phototransistor are connected to metal film 66 on the top surface of vertical cavity surface emitting laser 13 by metal strip 15, in the same manner that similar connections are provided in the structures of FIGS. 1 and 4.

Because no electrical and optical feedback is provided between a p-n junction of a light-emitting diode and a phototransistor in the structure of FIG. 5, the structure of FIG. 5 includes no latching or bistable characteristics. Instead, the structure of FIG. 5 includes non-latched heterojunction phototransistor 74 connected in series with vertical cavity surface emitting laser 13. In response to the intensity of the optical energy incident on phototransistor 74 exceeding a predetermined level, the collector emitter impedance of the phototransistor drops to a sufficient level to couple the voltage at film 21 to film 66 to energize laser 13 into a lasing condition. In response to the intensity of the optical energy dropping below that same threshold value, the emitter collector impedance of phototransistor 74 increases to sufficiently reduce the current supplied to laser 13 to a value insufficient to energize the laser into a lasing condition.

Reference is now made to FIGS. 6a and 6b of the drawing, respectively an electric schematic diagram and a perspective view of an AND gate in accordance with the present invention. As illustrated in FIG. 6a, the AND gate includes series connected photothyristors 90 and 92, in turn connected in series with vertical cavity surface emitting laser 94. The series combination of photothyristors 90 and 92, with laser 94, is connected across a DC power supply voltage between positive terminal 96 and ground 98. Photothyristors 90, 92 are pnpn structures of the type illustrated in FIGS. 1 or 4, while laser 94 is the same as vertical cavity surface emitting laser 13, FIGS. 1 and 4.

In response to optical energy exceeding a threshold being incident on both of photothyristors 90 and 92, a low impedance path is provided from terminal 96 to laser 94, causing the laser to be energized into a lasing condition. In response to the intensity of the optical energy incident on photothyristor 90 and/or 92 being less than the switching ON to OFF levels of one or both photothyristors, one or both of the photothyristors is activated to a high impedance state to prevent current from flowing from terminal 96 to laser 94, whereby no optical energy is emitted from the laser.

A perspective view of a physical structure for providing the circuit schematically illustrated in FIG. 6a is illustrated in FIG. 6b. Photothyristors 90, 92 and vertical cavity surface emitting laser 94 are carried by semi-insulating GaAs substrate 100, overlaid by n gallium arsenide contact layer 102 (corresponding to layer 29 (FIG. 1), in turn overlaid by semiconductor mirror layers 104 (corresponding to layers 31, FIG. 1). Layers 104 are overlaid by active lasing region 119 corresponding with layers 32–35 and 37–41, FIG. 1. Active lasing region 119 is overlaid by semiconductor mirror layers 120 corresponding with layers 44, FIG. 1. Layers 104 and 120, as well as region 119, in the center and on the left side of FIG. 6b correspond with laser 69 on the left side of FIG. 1, while layers 104 and 121 as well as region 119 on the right side of FIG. 6b, form laser structure 116, corresponding with laser 94, FIG. 6a, and laser 13, FIG. 1. Laser 116 also includes proton implant regions 117 and 118 (basically corresponding with implant region 43).

Spaced isolation diodes 106 and 108, constructed in the same manner as p-i-n diode 51 (FIG. 1), are formed on layers 121. Mesa pnpn photothyristor structures 110 and 112, both of which are identical to pnpn photothyristor structure 11 illustrated in FIG. 1, are respectively deposited on p-i-n isolation diodes 106 and 108. Pnpn structures 110 and 112 are respectively equivalent to photothyristors 90 and 92, FIGS. 6a.

Regions 137, 138 and 139 of the upper surface of layers 120 not covered by photothyristor structures 110 and 112 and laser structure 116 are implanted with hydrogen ions. Proton implant regions 137–139 between photothyristor structures 110, 112 and laser structure 116 avoid the need for a groove between the photothyristors and the laser as in the configuration of FIG. 1. The sidewalls of photothyristor structures 110 and 112, as well as of laser structure 116, are covered with a dielectric coating (not shown).

Metal contact pads 122 and 124 are respectively deposited on the proton implanted region 137 and the top face of substrate 100, to the right of the vertical cavity surface emitting laser structure. Positive DC and ground potentials are respectively applied to pads 122 and 124.

To provide connections between pads 122 and 124 to enable energization of photothyristor structures 110 and 112, as well as laser structure 116, metal stripes 130, 132, 134 and 136 are deposited on the structure illustrated in FIG. 6b. Stripe 130 extends between pad 122 along the top surface of implant region 137, thence along dielectric coatings on the vertical and intermediate horizontal faces of structure 110, to metal electrode film 141, having window 143 therein, on the top of structure 110. Stripe 132 extends from contact layer 145 (constituting the emitter of the heterojunction phototransistor of structure 110) along a dielectric layer on the vertical wall at the bottom of structure 110 to the top surface of implant portion 139, thence along dielectric layers on vertical and intermediate horizontal surfaces of structure 112, to electrode 140, having window 147 therein at the top of structure 112. Stripe 134 extends from emitter contact layer 151 of the heterojunction phototransistor of structure 112 along a bottom vertical wall of structure 112, thence along the upper face of implant region 139 and along dielectric vertical surfaces of laser 116, to electrode 149, having window 151 therein, at the top of laser structure 116. Stripe 136 connects metal pad 153 on n type gallium arsenide layer 102, forming the anode electrode of laser 116, to pad 124 by extending across the top faces of layers 102 and substrate 100. Hence, stripes 130, 132, 134 and 136 connect pnpn structures 110 and 112 in series with each other and laser structure 116 to provide the connections schematically illustrated in FIG. 6a.

Reference is now made to FIGS. 7a and 7b of the drawing, respectively a schematic circuit diagram and a perspective view of a multi-port OR gate including pnpn photothyristor and vertical cavity surface emitting laser structures, of the type illustrated in FIG. 1. As illustrated in FIG. 6a, photothyristors 440 and 442 are connected in parallel with each other, with the parallel combination being connected in series with vertical cavity surface emitting laser 444. The circuit is energized by a positive DC voltage connected between positive power supply terminal 446 and ground terminal 448.

In response to optical energy having an intensity above a predetermined threshold being incident on photothyristors 440 and/or 442, a low impedance path is provided from terminal 446 to laser 444, to energize the laser into a lasing condition. In response to the intensity of the optical energy on both of photothyristors 440 and 442 being less than the turn OFF threshold levels of the photothyristors, both of the photothyristors are in an OFF state, so that insufficient current is supplied by the voltage source at terminal 446 to laser 444, preventing energization of the laser into a lasing condition.

A perspective view of structure in accordance with the invention for providing the functions performed by the schematic diagram of FIG. 7a is illustrated in FIG. 7b. In FIG. 7b, layers 102 and 104 are overlaid on semi-insulating GaAs substrate 100 in the same manner described in connection with FIG. 6b. Vertical cavity surface emitting laser 444 is formed on layer 104 in the same manner as laser structure 116, FIG. 6b, and laser structure 13, FIG. 1.

Photothyristors 440 and 442 are formed on a single p-i-n isolation structure 150 deposited above a vertical cavity surface emitting laser structure. Structure 150 includes undoped aluminum arsenide stop-etch and undoped gallium arsenide thick layers, formed in the same manner as the corresponding layers 50 and 52 in FIG. 1. $N^+$ gallium arsenide contact layer 152 is deposited on isolation structure 150. Photothyristor pnpn structure 154 including layers corresponding with the layers forming photothyristor 11, FIG. 1, are deposited on layer 152.

To separate photothyristors 440 and 442, pnpn structure 154 is proton implanted with $H^+$ ions to form isolation region 156. Region 156 extends completely across and through the thickness of pnpn mesa structure 154, between the vertical walls thereof, to $n^+$ gallium arsenide contact layer 152. Thereby, two separate photothyristors are provided on the same mesa.

Electrical isolation between the devices deposited on layer 104, i.e., between pnpn structure 154 and laser 444, as well as for conductors and a pad for terminal 446, is provided by proton implanting regions 158 and 160 on layers 120 to the left (as viewed in FIG. 7b) of pnpn structure 154 and between pnpn structure 154 and laser 444.

To provide energization between terminals 146 and 148, FIG. 7a, metal contact pads 162 and 164 are provided. Contact pad 162 is deposited on proton implanted region 158 and performs the function of terminal 446. Contact 164 is deposited on the upper face of substrate 100 to provide the function of ground terminal 448. Metal contact pads 166 and 168 are respectively deposited on the upper surfaces of $n^+$ layers 152 and 102, to the right of structure 154 and laser 444, respectively. The surfaces on the left sides of structure 154 and layer 152, as viewed in FIG. 7b, are coated with a dielectric (not shown). The upper surfaces of structure 154 and laser 444 are respectively coated with metal pads, or layers, 170 and 172; window 173 is formed in pad 172.

To provide the electrical connections for photothyristors 440, 442 and laser 444 between contact pads 162 and 164, metal stripes 174, 176 and 178 are deposited on upper surfaces of the structure illustrated in FIG. 7b. Stripe 174, on contact pads 162 and 170, extends over implanted region 158 and the dielectric surface on the left sides of layer 152 and structure 154. Stripe 176, connected between metal contact pads 166 and 172, extends over a dielectric layer on the vertical surface on the right side of $n^+$ layer 152, across implanted region 160 and over a dielectric wall on the left side of laser 144, as illustrated in FIG. 7b, to contact pad 172. Stripe 178, connecting pads 164 and 168, is deposited directly on the right wall of layer 102 and the upper face of substrate 100.

In contact pad 170 are windows 180 and 182, on opposite sides of proton implanted region 156, to provide photothyristors 440 and 442 with separate optical responses. Both of optical photothyristors 440 and 442 included in structure 154 are electrically connected in parallel to stripes 174 and 176 since contact 170 extends over the entire upper face of structure 154, except where windows 180 and 182 are formed and because contact 166 extends to both sides of implanted region 156.

Reference is now made to FIGS. 8a and 8b of the drawing wherein there are illustrated a schematic diagram and a perspective drawing of a NOR gate in accordance with a further embodiment of the present invention. As illustrated in FIG. 8a, the NOR gate includes photothyristors 190 and 192 (of the type illustrated in FIG. I), connected in shunt with each other and in parallel with vertical cavity surface emitting laser 194, of the type illustrated in FIG. 1. The parallel combination of elements 190, 192 and 194 is connected by current limiting resistor 200 between a positive DC power supply voltage at terminal 196 and ground terminal 198.

In response to optical energy being incident on neither of photothyristors 190 and 192, current from the source connected to terminal 196 is applied to laser 194, causing lasing thereof. In response to optical energy having an intensity above a predetermined threshold being incident on either of photothyristors 190 or 192, a low impedance path is provided between the electrodes of the photothyristor(s). The low impedance path between the electrodes of photothyristor(s) 190 and/or 192 prevents energization of laser 194 into a lasing condition.

The physical structure for providing the device illustrated by the schematic diagram of FIG. 8a is illustrated in FIG. 8b. In FIG. 8b are illustrated semi-insulating GaAs substrate 100, n type contact layer 102, mirror layers 104, active region 119 and mirror layers 120. Photothyristors 190, 192 and laser 194 are fabricated on mirror layers 120 in the same manner as structure 154 and laser structure 444, FIG. 7b. Implanted regions 156, 158 and 160 are provided in FIG. 8b in a similar manner to the corresponding implanted regions in FIG. 7b. Thereby, parallel photothyristors 190 and 192 and laser 194 are formed in structure 154 of FIG. 8b in a similar manner to that of parallel photothyristors 440 and 442 and laser 144 of FIG. 7b.

Connections between the elements of FIG. 8b, however, are quite different from connections to the elements in FIG. 7b. The connections in FIG. 8b are between contact pads 202 and 204, corresponding with terminals 196 and 198, by metal stripes 206, 208, 210, 212 and 214. Stripe 206 connects contact pads 202 and 170 to each other by extending across implant region 158 and a dielectric coating on the wall of structure 154 facing contact pad 202. Stripe 208 connects contact layer 170 on structure 154 to metal anode contact layer 172 of laser 194. To this end, stripe 208 extends from metal layer 170 across a dielectric layer on the walls of structure 154 and layer 152 across implant region 160, thence along a dielectric coating on the wall of laser 194 facing structure 154. Stripe 210 connects metal layer 216 on layer 152 of structure 154 to metal layer 218 on the portion of layer 102 extending beyond laser 194. Stripe 210 extends along dielectric layers on a vertical wall of region 152 and a sloping wall of the laser structure including layers 104, 120 and active region 119. Thereby, parallel connections are established between the two parallel photothyristors included in structure 154 and the anode and cathode of laser 194. Stripe 212 is connected between metal layer 218 to elongated resistive layer 220 deposited on substrate 100. The other end of resistive layer 220 is connected to grounded contact pad 204 by metal stripe 214 that extends across the upper face of substrate 100.

Reference is now made to FIGS. 9a and 9b of the drawing wherein there are respectively illustrated schematic and perspective views of an EXCLUSIVE OR gate in accordance with the present invention. The EXCLUSIVE OR gate includes series connected photothyristors 230 and 232, of the type illustrated in FIG. 1, connected in series with each other between equal magnitude positive and negative DC voltages at terminals 234 and 236, respectively. Vertical cavity surface emitting lasers 238 and 240 are connected in parallel back-to-back relationship with each other, in shunt between node 242 and ground terminal 244.

Photothyristors 230 and 232 are polarized so positive current flows through photothyristor 230 from terminal 234 to node 242 in response to optical energy above a threshold being incident on photothyristor 230. In response to optical energy above a threshold being incident on photothyristor 232, negative current flows from terminal 236 to node 242. Lasers 238 and 240 are polarized so that in response to a positive voltage exceeding a threshold being applied across laser 238, the laser is activated to a lasing condition; in response to a negative voltage at node 242 exceeding a predetermined threshold level, laser 240 is activated to a lasing condition.

In operation, one of lasers 238 or 240 is activated to a lasing condition in response to the optical signals incident on lasers 230 and 232 differing from each other. In response to the optical signals incident on lasers 230 and 232 being the same, neither of lasers 238 nor 240 is activated to a lasing condition.

In response to no optical energy being incident on photothyristors 230 and 232, the voltage at node 242 is zero because virtually no positive current flows from terminal 234 to node 242 through photothyristor 230 and virtually no negative current flows from terminal 236 through photothyristor 232 to node 242. The small opposite polarity currents which flow from terminals 234 and 236 under these conditions cause the total current which flows to ground from node 242 to be insufficient to energize either of lasers 238 or 240 into a lasing condition.

In response to optical energy being incident on both photothyristors 230 and 232, approximately equal positive and negative currents respectively flow from terminals 234 and 236 to node 242. The equal but opposite currents flowing to node 242 cancel so that the total current flowing from node 242 to ground 244 is insufficient to energize either of lasers 238 or 240 into a lasing condition. Hence, if the optical signals supplied to photothyristors 230 and 232 have the same value, neither of lasers 238 or 240 is in a lasing condition.

In response to optical energy above a threshold value being incident only on photothyristor 230, to the exclusion of photothyristor 232, positive current flows from terminal 234 to node 242, thence through the anode-cathode path of laser 238. Laser 238 is thereby energized into a lasing condition. Similarly, but in an opposite manner, in response to optical energy above a threshold being incident only on photothyristor 232, negative current flows from terminal 236 to node 242, thence through the cathode-anode path of laser 240. Laser 240 is energized to a lasing condition in response to the negative current flowing through its cathode-anode path. The optical energy derived from lasers 238 and 240 is preferably directed (either by fiber optic cables or lens) to a common detecting surface to provide an indication that the optical signals incident on photothyristors 230 and 232 have differing binary values.

The physical structure corresponding with the circuit diagram of FIG. 9a is illustrated in FIG. 9b wherein photothyristors 230, 232, of the type illustrated in FIG. 1, and vertical cavity surface emitting lasers 238 and 240, of the type illustrated in FIG. 1, are carried on semi-insulating GaAs substrate 100. Layers 102, 104 and 120, as well as active region 119, as described in connection with FIG. 6b, are deposited on substrate 100 and appropriately etched so that photothyristors 230 and 232 and circuitry associated therewith are deposited on a first portion of layers 120, while lasers 238 and 240, including other portions of layers 104 and 120 and region 119, are deposited on third and fourth portions of layer 102. Photothyristors 230, 232 are configured as separate mesa structures located in a straight line between contact pads 250 and 252.

Pads 240 and 252 are respectively deposited on ion implant portions 254 and 256 on the upper surface of layers 120. Metal contact pads 250 and 252 correspond with terminals 234 and 236 and are connected to positive and negative DC bias voltages. Implant region 258 is deposited on layers 120 between photothyristors 230 and 232 to separate the photothyristors. Metal contact pads 260 and 262 are respectively formed on the uppermost surfaces of photothyristors 230 and 232; windows 264 and 266 are respectively provided in pads 260 and 262 to enable optical energy to be incident on photothyristors 230 and 232. Metal contact pads 268 and 270 are respectively formed on the upper surfaces of layers 152 on the right side of photothyristors 230 and 232, as viewed in FIG. 9b. The walls of photothyristors 230 and 232 have dielectric layers (not shown) deposited thereon. Metal contact 272, which forms node 242, extends between the facing dielectric walls on layers 152 of photothyristors 230 and 232, over ion implant region 258.

Equal magnitude positive and negative voltages at contact pads 250 and 252 are selectively connected to contact pad 272 by metal stripes 274, 276 and 278, while photothyristors 230 and 232 are activated into the conducting, low impedance state in response to the intensity of optical energy passing through windows 264 and 266 exceeding threshold levels. Stripe 274 extends between contact pads 250 and 260, over ion implanted region 254 and the dielectric layer on the left wall of photothyristor 230, as viewed in FIG. 9b. Stripe 276 connects contact pads 262 and 268 to contact pad 272 by extending across facing dielectric covered walls of layers 152 of photothyristors 230 and 232. Stripe 276 also extends along a dielectric layer on the mesa structure of photothyristor 232. Stripe 278 extends between contact pads 252 and 270 along the wall of layer 152 facing contact 252 and along implanted region 256 on layer 104. Lasers 238 and 240 are positioned on contact layers 102 of substrate 100. Lasers 238 and 240 are spatially separated from each other by groove 280, having a longitudinal axis approximately aligned with the center line between photothyristors 230 and 232.

Metal contact pads 282 and 284 are deposited on the upper surfaces of layers 102 of lasers 238 and 240, respectively, such that contact pads 282 and 284 are respectively remote and proximate photothyristors 230 and 232. The top surfaces of lasers 238 and 240 are covered with metal contact pads 286 and 288 in which are located circular windows 290 and 292, respectively. Lenses (not shown) are preferably located in windows 290 and 292 so that optical energy emitted by lasers 238 and 240 is incident on a single detector surface.

Lasers 238 and 240 are electrically connected in parallel with each other, between metal contact pads 272 and 294, by metal stripes 296, 298, 300, 302, 304 and 306. Stripe 296 connects pad 272 to stripes 298 and 300 by extending from pad 272 over implant region 258 and over a dielectric layer (not shown) on layers 102, 104 and 120, as well as active region 119. Stripes 296, 298 and 300 are connected together on the upper face of semi-insulating silicon substrate 100. Stripe 298 extends from the junction with stripes 296 and 300 across the upper face of substrate 100, thence along a dielectric layer on the wall of laser 238 facing photothyristor 230. Stripe 298 is deposited on metal contact pad 286 on the anode of laser 238. Stripe 300 extends from the junction of stripes 296 and 298 along the upper face of substrate 100 to metal contact pad 284 on layer 102 of laser 240, to provide a connection to the cathode of laser 240. The connection from the cathode of laser 238 to contact pad 294 is provided by stripe 302 which extends along the wall of layer 102 of laser 238 and the upper face of substrate 100. The anode of laser 240 is connected to contact pad 294 by stripe 304 which extends from metal contact pad 288 along dielectric layers on the wall and layer 102 of laser 240, thence along the upper face of substrate 100. Metal stripes 302 and 304 have a common junction with metal stripe 306 that connects stripes 302 and 304 to contact pad 294.

Reference is now made to FIGS. 10a and 10b of the drawing, respectively a schematic diagram and a perspective view of a NAND gate in accordance with the present invention. The NAND gate comprises photothyristors 310 and 312, of the type illustrated in FIG. 1. Photothyristors 310 and 312 are series connected with each other and in parallel with vertical cavity surface emitting laser 314, of the type illustrated in FIG. 1. The circuit including elements 310, 312 and 314 is connected to a positive DC power supply voltage at terminal 316 and to ground terminal 318 by resistor 320.

In response to optical energy being incident on both of photothyristors 310 and 312 a low shunt impedance is provided from terminal 316 to resistor 320 around laser 314.

Thereby, a low level current flows to laser 314; the current is insufficient to activate the laser to a lasing condition. If no optical energy is incident on one or both of photothyristors 310 and 312, laser 314 is shunted by a high path so substantial current flows through the laser to energize it to a lasing condition.

The circuitry schematically illustrated in FIG. 10a is physically represented in FIG. 10b as including semi-insulating GaAs substrate 100 on which are deposited layers 102, 104 and 120 and active region 119. On layer 102 are formed vertical cavity surface-emitting laser 314 and corresponding laser structures on which are deposited photothyristors 310 and 312 and proton implant 322 photothyristors 310 and 312 are connected to each other and to metal contact pads 324 and 326 by metal stripes 328 in the same manner that photothyristors 230 and 232 are connected between metal contact pads 250 and 252 by stripes 274, 276 and 278 in FIG. 9b. Contact pad 324 is connected to the positive DC voltage at terminal 316.

The series combination of photothyristors 310 and 312 is shunted by laser 314, positioned on substrate 100 in proximity to contact pad 324. Laser 314 includes anode and cathode metal contact pads 328 and 330, respectively provided on the upper face of laser 314 and on the upper face of region 102 of laser 328. Anode contact pad 328 is connected to contact pad 324 by metal stripe 332 that extends between the two contact pads and along the vertical wall of implant 322 abutting against contact pads 324 and 328. Contact pads 326 and 330 are connected to each other by metal stripes 334 and 336. Metal stripe 334 extends from contact pad 326 along a dielectric layer on a vertical wall of implant region 322, layers 102, 104 and 120, as well as active region 119. Thence, stripe 334 extends along the upper face of substrate 100 to elongated resistive layer 338, forming resistor 320. The other end of resistive layer 338 on substrate 100 is connected to metal contact pad 340 on substrate 100 by metal stripe 342 on the substrate. Contact pad 340 is at ground potential terminal 318. Stripe 336 extends between stripe 334 and cathode contact pad 330 of laser 314 along the upper face of substrate 100 to complete the parallel connection of laser 314 to the series combination of photothyristors 310 and 312.

Figure 11:
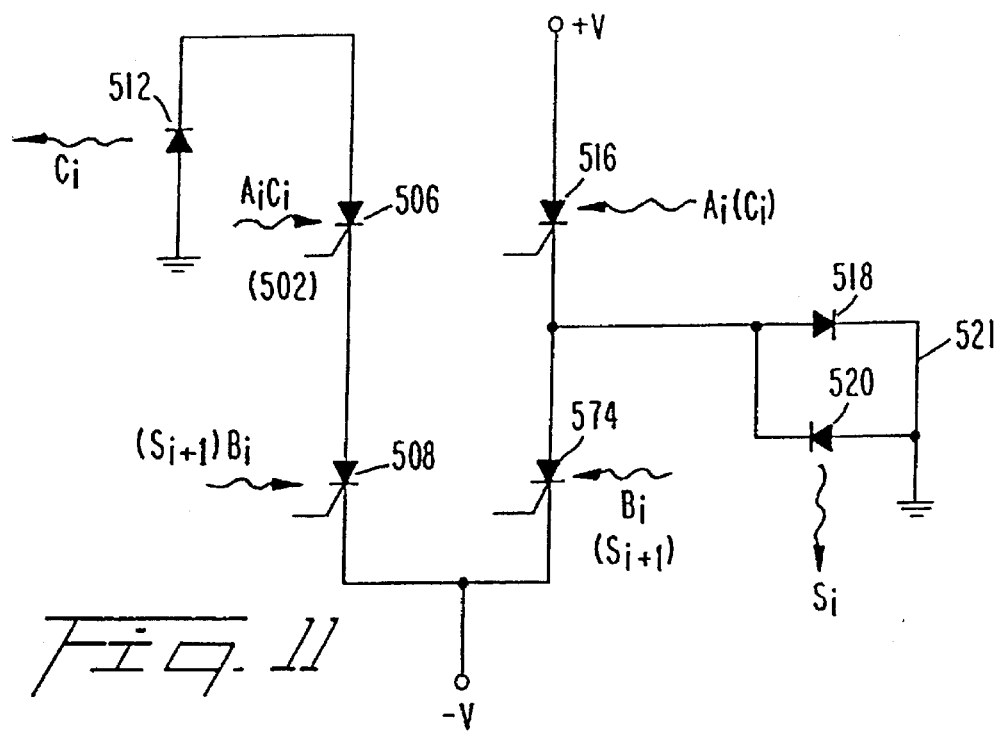
FIG. 11 is a schematic diagram of an electro-optical binary adder in accordance with another aspect of the present invention.

Binary addition of N-bit optical words A and B is performed by the apparatus illustrated in the schematic diagram of FIG. 11. Each word is represented as a horizontal array of optical input bits that are incident on a row of heterojunction phototransistors. The binary addition of each pair of optical bits $A_i$ and $B_i$ produces an optical carry bit $C_i$ and optical sum bit $S_i$, which are generated by surface-emitting lasers having positions contiguous to the corresponding phototransistor input bits along the rows of A and B, respectively. The carry and sum output bits are left-shifted and right-shifted relative to the input phototransistors, respectively. An N-bit binary addition requires N successive addition steps during which the carry bits are shifted from the rightmost (least significant bit) to the leftmost (most significant bit) position.

The entire addition process thus requires N-passes through the apparatus depicted in FIG. 11. In each successive pass through the adder of FIG. 11, the left-shifted carry bit $C_i$ is positioned so it lies above the right-shifted sum bit $S_{i+1}$, while the right-shifted sum-bit $S_i$ lies below the left-shifted carry-bit $C_{i-1}$. Each pair of vertically-aligned sum and carry bits serves as the new addend and augend input bits, respectively, for the next binary addition cycle, utilizing the same logic hardware for each pass.

The binary summing structure includes AND-gate 502 and EXCLUSIVE OR gate 504 responsive to bits $A_i$ and $B_i$ during the first pass, and to the sum bit $S_{i+1}$ and carry bit $C_i$ during successive passes, where $S_{i+1}$ results from the binary addition of optical inputs $A_{i+1}$ and $B_{i+1}$. AND gate 502 includes photothyristors 506 and 508, having series connected pnpn structures, in turn series connected to negative DC supply voltage 510 and vertical cavity surface-emitting laser 512. Hence, photothyristors 506, 508 and laser 512 are basically connected and arranged as illustrated in FIGS. 6a and 6b.

EXCLUSIVE OR gate 504 includes photothyristors and 516, having pnpn structures series connected between equal magnitude negative DC power supply terminal 510 and positive DC power supply terminal 518. Oppositely polarized parallel vertical cavity surface emitting lasers 520 and 522 (comprising laser emitter 521) are connected between ground and a common terminal for photothyristors 514 and 516. Hence, EXCLUSIVE OR gate 504 is arranged and constructed as described in connection with FIGS. 9a and 9b.

During a first pass of an N-pass cycle, photothyristors 506 and 516 are responsive to optical signals representing bit $A_i$, while photothyristors 508 and 514 are responsive to bit $B_i$ during a first pass of an N-pass cycle. In the next pass, optical outputs $C_i$ and $S_{i+1}$ become the new input optical bits $A_i$ and $B_i$. In successive passes, photothyristors 506 and 516 are responsive to carry bit $C_i$, while photothyristors 508 and 514 are responsive to sum bit $S_{i+1}$, generated during the previous addition cycle.

In response to bits $A_i=B_i=1$, laser 512 is responsive to current from terminal 510, to emit a carry bit $C_i=1$. For all other combinations of $A_i$ and $B_i$, laser 512 is not energized and carry bit $C_i$ has a binary zero value. If the states of photothyristors 514 and 516 are the same because $B_i=A_i$, the voltage supplied to lasers 518 and 520 is inadequate to activate either of the lasers into a lasing condition so emitter 521 is inactive. If, however, $B_i \neq A_i$, one of photothyristors 514 or 516 is in an ON condition, the other photothyristor is in an OFF condition, so a positive or negative voltage is supplied to the parallel combination of lasers 518 and 520, to activate emitter 521 into a lasing condition. Since the optical energy emitted by lasers 518 and 520 is directed to a single detecting surface, the presence or absence of optical energy from emitter 521 indicates the magnitude of the sum operation resulting from the combination of bits $A_i$ and $B_i$ (or $C_i$ and $S_{i+1}$ during successive cycles).

Figure 12:
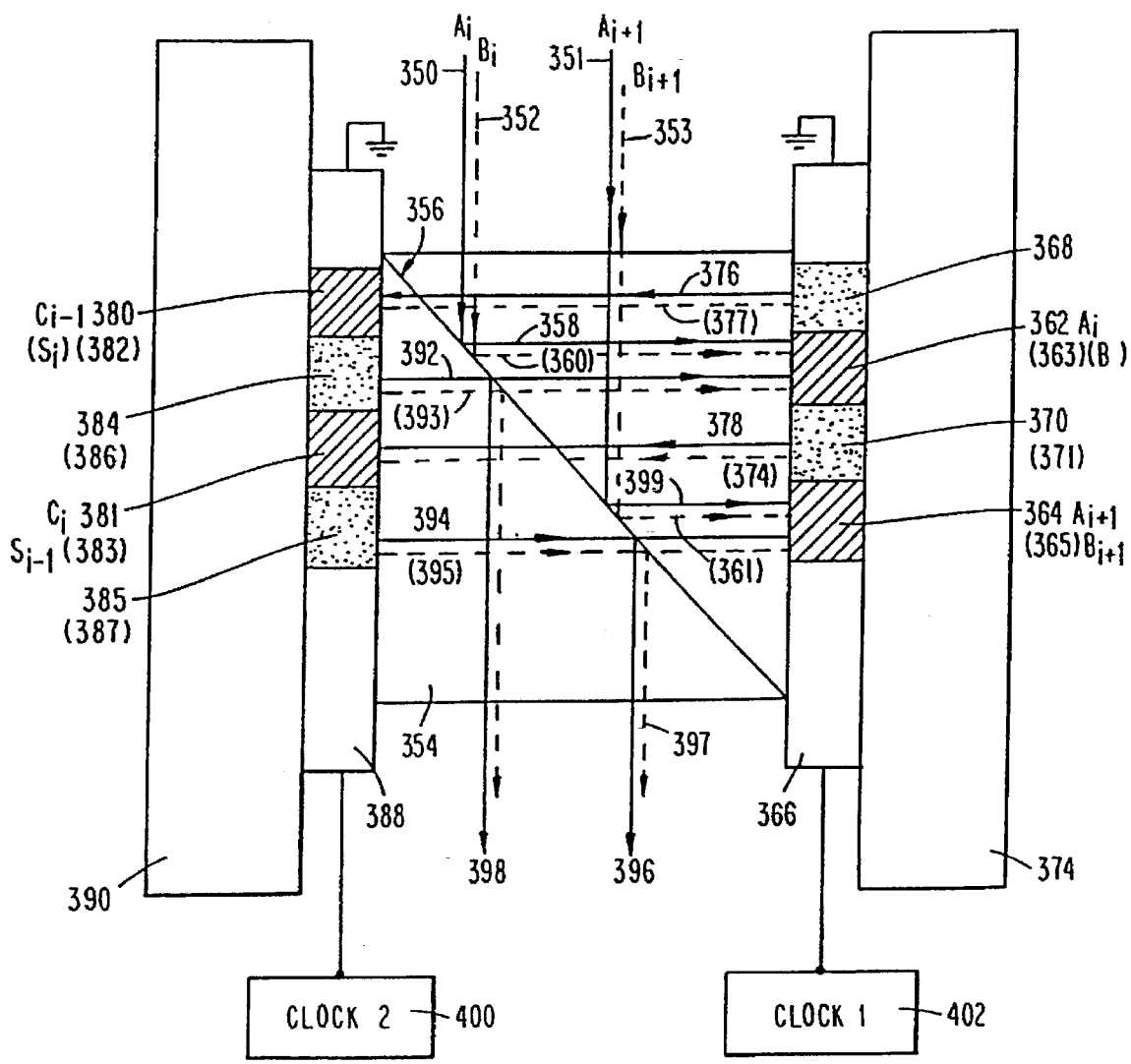
FIG. 12 is a physical schematic diagram in one plane of an adder incorporating the structure of FIG. 11.
Figure 13:
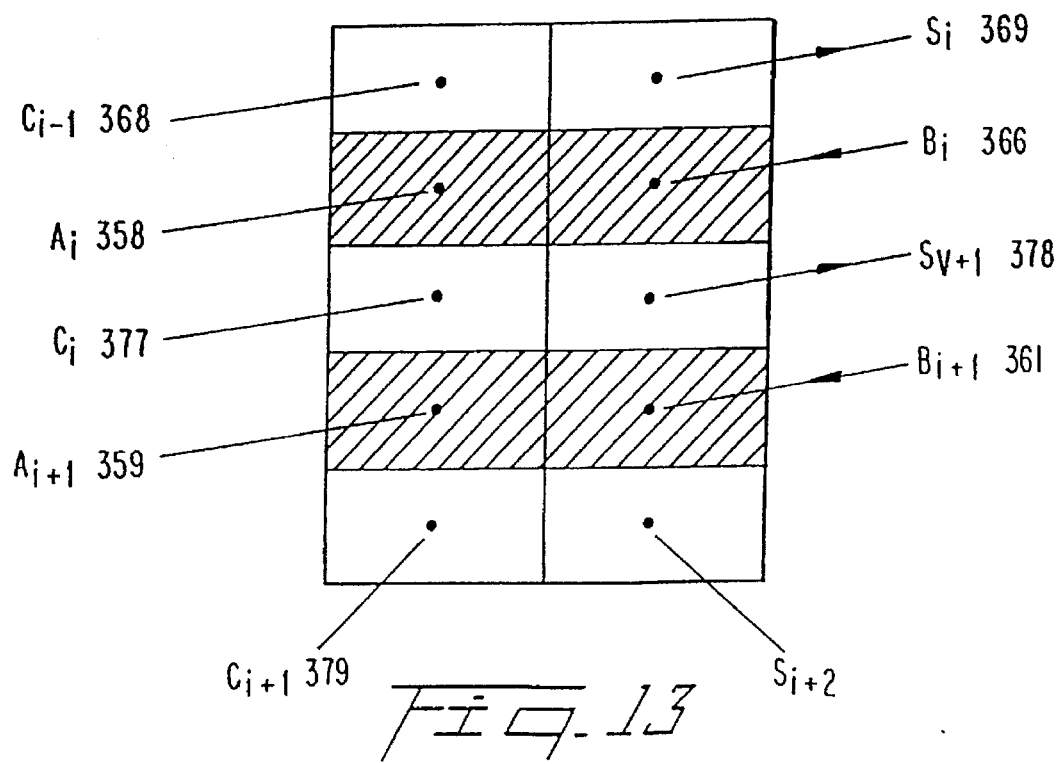
FIG. 13 is an explanatory drawing of a portion of the structure illustrated in FIG. 11 in a plane at right angles to the plane illustrated in FIG. 12.

A preferred embodiment of a multi-bit binary adder incorporating the structure illustrated in FIG. 11 is illustrated in FIG. 12; FIG. 13 is a schematic representation of the structure illustrated in FIG. 12, in a plane at right angles to the plane illustrated in FIG. 12. In FIGS. 12 and 13, bits $A_i$, $B_i$, $A_{i+1}$ and $B_{i+1}$ are respectively indicated by beams 350–353.

Reference is now made to FIGS. 12 and 13 of the drawing, schematic electro-optical drawings in two planes at right angles to each other of an optical binary adder utilizing the principles of FIG. 11. The structure of FIGS. 12 and 13 performs a binary addition function on binary optical signals including bits $A_i$, $A_{i+1}$, $B_i$ and $B_{i+1}$, respectively represented by beams 350–353, applied to a common external face of polarizing beam splitter prism 354. Bits $A_i$ and $A_{i+1}$ are included in binary word A while bits $B_i$ and $B_{i+1}$ are included in binary word B. The beams associated with word A lie along columns in the plane of the sheet of FIG. 12 while the beams associated with word B lie in columns parallel to columns A in the plane of the sheet of FIG. 12. As illustrated in FIG. 13, beams 350 and 352 associated with bits $A_i$ and $B_i$ are aligned in the row at right angles to the columns of A and B in the plane of the sheet of FIG. 12.

Prism 354 includes internal face 356 where beams 350–353 are turned through an angle of 90° to form beams 358–361, respectively. Beams 358, 359 and 360, 361 are respectively incident on photothyristor structures 362–365. Photothyristor structures 362 and 364 are carried by semi-insulating substrate 366, of the type illustrated in FIGS. 6–10. Substrate 366 also carries vertical cavity surface-emitting laser structures 368–371 (preferably of the type illustrated in FIG. 1), respectively responsive to optical energy from photothyristor structures 362–365.

Bias voltage is applied to elements 362–365 and to 368–371 by clock source 372 so that when the clock source derives a positive voltage, laser structures 368–371 can be energized and photothyristor structures 362–365 can be latched. In response to ground or negative voltage being derived from clock source 372, photothyristor structures 362–365 are "de-latched," i.e., the photothyristor structures are activated to an "off" state regardless of the intensity of the optical energy incident thereon. The ground or zero voltage from source 372 also prevents energization of laser structures 368–371. Substrate 366 is preferably mounted on heat sink 374.

Beams 358 and 360 for bits $A_i$ and $B_i$ are respectively incident on photothyristor structures 362 and 363, respectively corresponding with photothyristors 506 and 504 for bit $A_i$, and photothyristors 508 and 514 for bit $B_i$; beams 359 and 361 for bits $A_{i+1}$ and $B_{i+1}$ are respectively incident on photothyristor structures 364 and 365 also corresponding with photothyristors 504 and 506 for bit $A_{i+1}$ and photothyristors 508 and 514 for bit $B_{i+1}$. Beams corresponding with sum and carry bits $S_{i+1}$ and $C_i$ are respectively incident on photothyristor structures 362 and 363 corresponding with photothyristors 508 and 514 for bit $S_{i+1}$ and photothyristors 504 and 506 for bit $C_i$; feedback beams corresponding with sum and carry bits $S_{i+2}$ and $C_{i+1}$ are incident on photothyristor structures 364 and 365 also corresponding with photothyristors 508 and 514 for bit $S_{i+1}$ and photothyristors 504 and 506 for bit $C_{i+1}$.

Laser structures 368 and 369 and 370 and 371 are arranged so each of structures 368 and 370 contains one laser and each of structures 369, 371 contains two lasers connected in parallel back-to-back relation. The beams from the laser structures 369 and 371 corresponding with lasers 518 and 520 are closely-spaced or converged by lenses into a single beam. Laser structures 368 and 369, respectively corresponding with lasers 512 and 521, derive beams 376 and 377 corresponding with carry beam $C_{i+1}$ and sum beam $S_i$. Laser structures 370 and 371, respectively corresponding with lasers 512 and 521, derive beams 378 and 379, corresponding with carry beam $C_i$ and sum beam $S_{i+1}$.

Beams 376–379 completely traverse prism 354 so they are respectively incident on latching photothyristors 380–383, of the type illustrated in FIG. 1. Photothyristors 380–383 are physically and optically aligned with lasers 368–371, respectively. Photothyristors 380–383 are respectively electrically connected to vertical cavity surface-emitting lasers 384–387, preferably of the type illustrated in FIG. 1.

Elements 380–387 are carried by semi-insulating substrate 388 of the type illustrated in FIGS. 6–10. Substrate 388 is preferably carried by heat sink 390. Substrates 356 and 388 are positioned proximate parallel opposite faces of prism 354 so that the optical energy incident on and transmitted from the elements thereon is normal to the proximate prism faces. Optical energy emitted from lasers 384–387 propagates as beams 392–395 to face 356, where the beams are turned 90° to provide output beams 396–399. Beams 392–395 also propagate through face 356 to be incident on photothyristor structures 362 and 364, respectively. Beams 392, 393, 394 and 395 respectively correspond with carry and sum beams $S_{i+1}$, $S_i$, $C_i$ and $S_{i+1}$.

Photothyristors 380–383 and lasers 384–387 are connected to be responsive to DC levels of clock source 400. Clock source 400 energizes elements 380–387 in basically the same manner as energization of elements 362–371 by clock source 372. The structure on substrate 366 performs logic functions as described, while the structure on substrate 388 can be considered as a memory buffer.

Figure 12A:
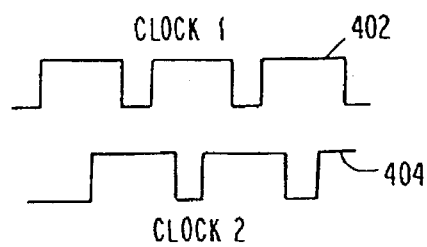
FIG. 12A graphically depicts periodic waveforms generated by the clock structure shown in FIG. 12.

Clock sources 372 and 400 respectively derive periodic waveforms 402 and 404, shown in FIG. 12A, (having the same frequency) that are 180° out of phase with each other and have duty cycles of two-thirds so that there is overlap between the positive voltage portions thereof. Thereby, de-latching of photothyristor structures 362 and 364 occurs at times 180° displaced from de-latching of photothyristors 380–383. Because of the overlapping occurrence times of the positive portions of waveforms 402 and 404, the elements on substrates 366 and 388 are simultaneously electrically energized with a duty cycle of one-half. Clock waveforms 402 and 404 thus enable the elements on substrates 366 and 388 to be periodically energized in the following four-step sequence: (1) all of the elements on substrates 366 and 388 can be energized; (2) only elements on substrate 388 can be energized; (3) all of the elements on both substrates can be energized; and (4) only the elements on substrate 366 can be energized.

Beams 396–399 are considered as sum and carry bits of a binary addition operation resulting from input beams 350–353. As time progresses and the binary values of the signals associated with beams 350–353 change, there are corresponding changes in the amplitudes of beams 396–399. Because of the feedback loop extending from latching photothyristor structures 362 and 364 to lasers 368–371, thence to latching photothyristors 380–383 and from photothyristors 380–383 to lasers 384–387, binary addition is provided and represented by the intensity of the optical energy of sum and carry beams 396–399.

While the structure of FIG. 11 is illustrated for the situation of input beams 350–353 and sum and carry output beams 396–399, it is to be understood that parallel processing of many input and output beams can be provided by increasing the number of beams incident on prism 354 and accordingly increasing the number of latching photothyristors and lasers on substrates 366 and 388. Further, it is possible to cascade many stages of the type illustrated in FIG. 11 since the lasers emit wavelengths that can be detected by the photothyristors.

While there have been described and illustrated several specific embodiments of the invention, it will be clear that variations in the details of the embodiments specifically illustrated and described may be made without departing from the true spirit and scope of the invention as defined in the appended claims.

I claim:

1. An electro-optical EXCLUSIVE OR gate responsive to first and second binary optical signals comprising first and second photodetectors respectively responsive to the first and second binary optical signals and connected to each other so that a node connected to the photodetectors is at first and second different voltages in response to the optical signals respectively having the same and differing values, and optical energy emitting means connected to said node so that optical energy emitted by said means has first and second states in response to the first and second voltages being at the node, respectively.

2. The electro-optical EXCLUSIVE OR gate of claim 1 wherein the first and second photodetectors are connected to different DC voltages that are coupled to the node via the first and second photodetectors in response to the first and second optical signals being incident on the first and second optical detectors, the optical energy emitting means including first and second photoemitters connected in parallel to said node and arranged so that the first and second photoemitters are respectively activated in response to the first and second voltages being at the node and neither of the photoemitters is activated in response to the node being at a voltage between the first and second voltages.

3. The electro-optical EXCLUSIVE OR gate of claim 2 wherein the first and second photoemitters comprise first and second vertical cavity surface emitting lasers on a substrate, the first and second photodetectors comprising first and second heterojunction phototransistors on the substrate, the node being on the substrate, the lasers and phototransistors having electrodes connected to the node by conductors on the substrate.

4. The electro-optical EXCLUSIVE OR gate of claim 2 wherein the first and second voltages have substantially the same magnitude and opposite polarity.

* * * * *